(12) United States Patent
Hwang et al.

(10) Patent No.: US 12,532,465 B2
(45) Date of Patent: Jan. 20, 2026

(54) THREE-DIMENSIONAL (3D) SEMICONDUCTOR MEMORY DEVICE INCLUDING A SEPARATION STRUCTURE AND ELECTRONIC SYSTEM INCLUDING THE SAME

(71) Applicant: Samsung Electronics Co., Ltd., Suwon-si (KR)

(72) Inventors: Sung-Min Hwang, Hwaseong-si (KR); Jae-Joo Shim, Suwon-si (KR); Dong-Sik Lee, Hwaseong-si (KR); Bongtae Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 468 days.

(21) Appl. No.: 17/678,473

(22) Filed: Feb. 23, 2022

(65) Prior Publication Data

US 2023/0005942 A1    Jan. 5, 2023

(30) Foreign Application Priority Data

Jul. 5, 2021    (KR) ........................ 10-2021-0087664

(51) Int. Cl.
*H10B 41/46*    (2023.01)
*H01L 23/522*    (2006.01)
(Continued)

(52) U.S. Cl.
CPC ......... *H10B 41/46* (2023.02); *H01L 23/5226* (2013.01); *H01L 23/5283* (2013.01);
(Continued)

(58) Field of Classification Search
CPC ........ H10B 41/46; H10B 41/10; H10B 41/27; H10B 41/35; H10B 43/27; H10B 43/40; H01L 23/5226
(Continued)

(56) References Cited

U.S. PATENT DOCUMENTS 8,492,797 B2    7/2013    Hwang et al.
9,401,309 B2    7/2016    Izumi et al.
(Continued)

FOREIGN PATENT DOCUMENTS

KR    20200008828 A    1/2020

*Primary Examiner* — Norman D Richards
*Assistant Examiner* — Laura M Dykes
(74) *Attorney, Agent, or Firm* — Harness, Dickey & Pierce, P.L.C.

(57) ABSTRACT

A 3D semiconductor memory device includes a substrate, a stack structure comprising interlayer dielectric layers and gate electrodes alternately and repeatedly stacked on the substrate, vertical channel structures penetrating the stack structure, a separation structure spaced apart from the vertical channel structures and filling a trench crossing the stack structure, the separation structure comprising a spacer covering an inner sidewall of the trench, and a first conductive contact filling an inner space of the trench surrounded by the spacer, an insulating layer covering the substrate and the stack structure, contact plugs penetrating the insulating layer so as to be connected to the gate electrodes of the stack structure, and a second conductive contact spaced apart from the stack structure and penetrating the insulating layer so as to be connected to a peripheral circuit transistor. A bottom surface of the first conductive contact is at a level lower than a bottom surface of the spacer.

18 Claims, 14 Drawing Sheets

(51) Int. Cl.
*H01L 23/528* (2006.01)
*H10B 41/10* (2023.01)
*H10B 41/27* (2023.01)
*H10B 41/35* (2023.01)
*H10B 43/10* (2023.01)
*H10B 43/27* (2023.01)
*H10B 43/40* (2023.01)

(52) U.S. Cl.
CPC ............ *H10B 41/10* (2023.02); *H10B 41/27* (2023.02); *H10B 41/35* (2023.02); *H10B 43/10* (2023.02); *H10B 43/27* (2023.02); *H10B 43/40* (2023.02)

(58) Field of Classification Search
USPC ........................................................ 257/314
See application file for complete search history.

(56) References Cited

U.S. PATENT DOCUMENTS

| | | | |
|---|---|---|---|
| 9,449,986 B1 | 9/2016 | Yoon et al. | |
| 10,032,666 B2 | 7/2018 | Shin | |
| 10,586,797 B2 | 3/2020 | Kim et al. | |
| 10,861,871 B2 | 12/2020 | Tobioka | |
| 2015/0084204 A1 | 3/2015 | Yun et al. | |
| 2016/0293625 A1* | 10/2016 | Kang | H01L 23/528 |
| 2018/0083034 A1* | 3/2018 | Mori | H10B 43/10 |
| 2019/0067314 A1* | 2/2019 | Lu | H01L 24/05 |
| 2019/0067320 A1* | 2/2019 | Cho | H01L 21/76877 |
| 2020/0027893 A1* | 1/2020 | Yang | H10B 41/50 |
| 2021/0035910 A1 | 2/2021 | Kim et al. | |
| 2021/0036001 A1* | 2/2021 | Kim | H10D 1/716 |

\* cited by examiner

THREE-DIMENSIONAL (3D) SEMICONDUCTOR MEMORY DEVICE INCLUDING A SEPARATION STRUCTURE AND ELECTRONIC SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0087664, filed on Jul. 5, 2021, in the Korean Intellectual Property Office, the disclosure of which is hereby incorporated by reference in its entirety.

BACKGROUND

Embodiments of the inventive concepts relate to a three-dimensional (3D) semiconductor memory device, a method of manufacturing the same and an electronic system including the same, and more particularly, to a non-volatile 3D semiconductor memory device including a vertical channel structure, a method of manufacturing the same and an electronic system including the same.

An electronic system requiring data storage may require a semiconductor device capable of storing high-capacity data. To provide improved performance and/or lower price of a semiconductor device while increasing data storage capacity of the semiconductor device, it may be advantageous to increase an integration density of the semiconductor device. An integration density of a two-dimensional (2D) or planar semiconductor device may be mainly determined by an area that a unit memory cell occupies. Therefore, the integration density of the 2D or planar semiconductor device may be affected by a technique of forming fine patterns. However, since higher-priced apparatuses may be required to former fine patterns, the integration density of 2D semiconductor devices continues to increase, but may be still limited. Thus, three-dimensional (3D) semiconductor memory devices have been developed to overcome the above limitations. 3D semiconductor memory devices may include memory cells three-dimensionally arranged.

SUMMARY

Embodiments of the inventive concepts may provide a three-dimensional (3D) semiconductor memory device with improved electrical characteristics and/or reliability, and a method of manufacturing a 3D semiconductor memory device, which is capable of reducing difficulty and/or costs of manufacturing processes.

Embodiments of the inventive concepts may also provide an electronic system including the 3D semiconductor memory device.

In an aspect, a 3D semiconductor memory device may include: a substrate; a stack structure comprising interlayer dielectric layers and gate electrodes which are alternately and repeatedly stacked on the substrate; vertical channel structures penetrating the stack structure; a separation structure spaced apart from the vertical channel structures and filling a trench crossing the stack structure, the separation structure comprising a spacer covering an inner sidewall of the trench, and a first conductive contact filling an inner space of the trench surrounded by the spacer; an insulating layer covering the substrate and the stack structure; contact plugs penetrating the insulating layer so as to be connected to the gate electrodes of the stack structure; and a second conductive contact spaced apart from the stack structure and penetrating the insulating layer so as to be connected to a peripheral circuit transistor. A bottom surface of the first conductive contact may be at a level lower than a bottom surface of the spacer.

In an aspect, a 3D semiconductor memory device may include: a substrate; a stack structure comprising interlayer dielectric layers and gate electrodes which are alternately and repeatedly stacked on the substrate; vertical channel structures in vertical channel holes penetrating the stack structure; a separation structure spaced apart from the vertical channel structures and filling a trench crossing the stack structure, the separation structure comprising a spacer covering an inner sidewall of the trench, and a first conductive contact filling an inner space of the trench surrounded by the spacer; a common source region vertically overlapping with the separation structure and in an upper portion of the substrate; an insulating layer covering the substrate and the stack structure; a second conductive contact spaced apart from the stack structure and penetrating the insulating layer so as to be connected to a peripheral circuit transistor; a first contact plug penetrating the insulating layer so as to be connected to the first conductive contact of the separation structure; second contact plugs penetrating the insulating layer and at least a portion of the stack structure so as to be connected to the gate electrodes; and a third contact plug penetrating the insulating layer so as to be connected to the second conductive contact. A top surface of the first conductive contact and a top surface of the second conductive contact may be at a level lower than top surfaces of the first to third contact plugs and higher than top surfaces of the vertical channel structures. A bottom surface of the first conductive contact may be at a level lower than a bottom surface of the spacer.

In an aspect, an electronic system may include: a 3D semiconductor memory device comprising a first substrate, a peripheral circuit structure on the first substrate, a cell array structure on the peripheral circuit structure, an insulating layer covering the cell array structure, and an input/output pad on the insulating layer and electrically connected to the peripheral circuit structure; and a controller electrically connected to the 3D semiconductor memory device through the input/output pad and configured to control the 3D semiconductor memory device. The cell array structure may include: a second substrate on the peripheral circuit structure; a stack structure comprising interlayer dielectric layers and gate electrodes which are alternately and repeatedly stacked on the second substrate; vertical channel structures penetrating the stack structure; a separation structure spaced apart from the vertical channel structures and filling a trench crossing the stack structure, the separation structure comprising a spacer covering an inner sidewall of the trench, and a first conductive contact filling an inner space of the trench surrounded by the spacer; contact plugs penetrating the insulating layer so as to be connected to the gate electrodes of the stack structure; and a second conductive contact spaced apart from the stack structure and penetrating the insulating layer so as to be electrically connected to the peripheral circuit structure. A bottom surface of the first conductive contact may be at a level lower than a bottom surface of the spacer.

BRIEF DESCRIPTION OF THE DRAWINGS

The inventive concepts will become more apparent in view of the attached drawings and accompanying detailed description.

DETAILED DESCRIPTION OF EXAMPLE EMBODIMENTS

Hereinafter, example embodiments of the inventive concepts will be described in more detail with reference to the accompanying drawings.

Figure 1:
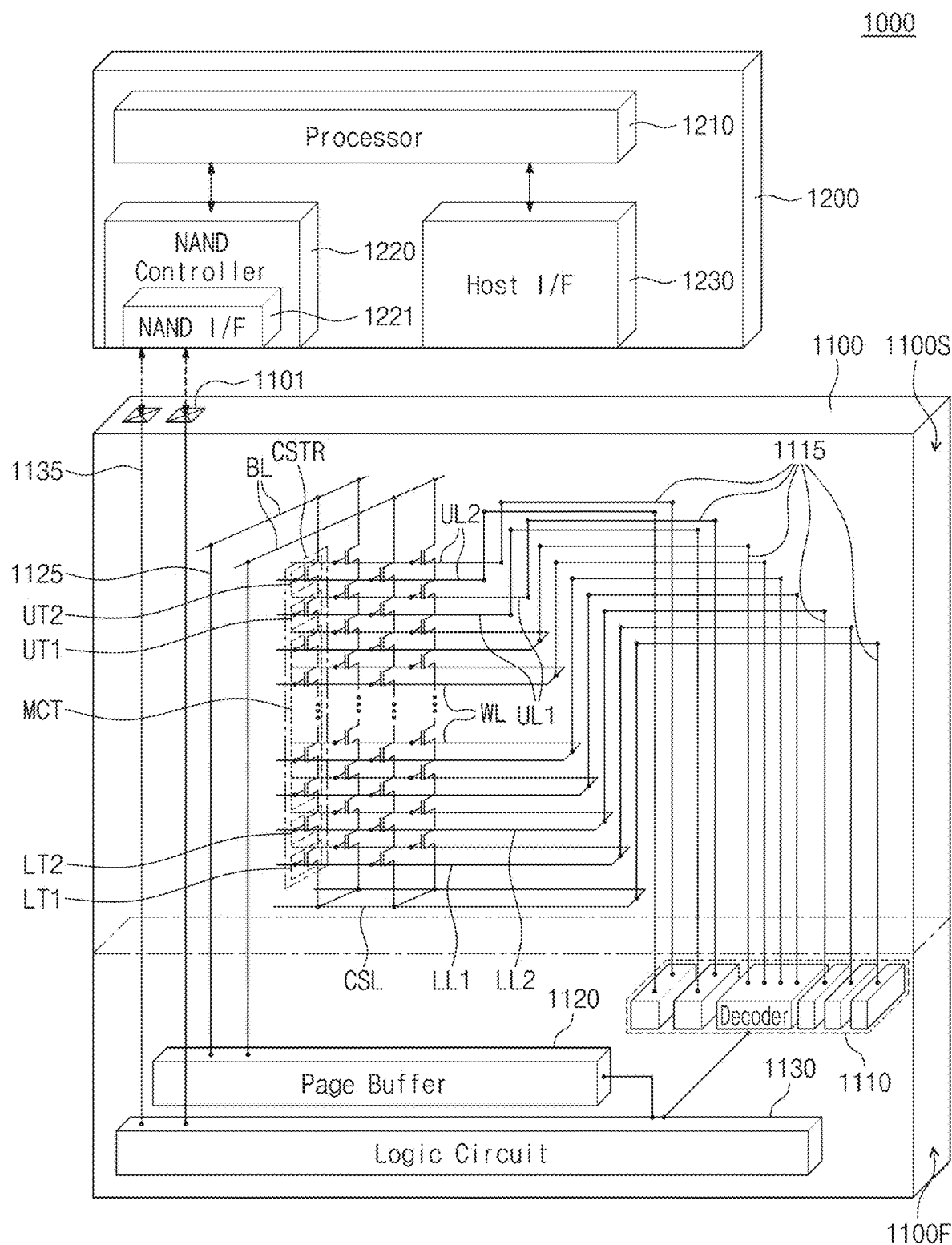
FIG. 1 is a schematic view illustrating an electronic system including a three-dimensional (3D) semiconductor memory device according to some example embodiments of the inventive concepts.

FIG. 1 is a schematic view illustrating an electronic system including a three-dimensional (3D) semiconductor memory device according to some example embodiments of the inventive concepts.

Referring to FIG. 1, an electronic system 1000 according to some example embodiments of the inventive concepts may include a 3D semiconductor memory device 1100 and/or a controller 1200 electrically connected to the 3D semiconductor memory device 1100. The electronic system 1000 may be a storage device including one or more 3D semiconductor memory devices 1100, or an electronic device including the storage device. For example, the electronic system 1000 may be a solid state drive (SSD) device, a universal serial bus (USB) device, a computing system, a medical device, or a communication device, which includes the one or more 3D semiconductor memory devices 1100.

The 3D semiconductor memory device 1100 may be a non-volatile memory device and may be, for example, a 3D NAND flash memory device to be described later. The 3D semiconductor memory device 1100 may include a first region 1100F and a second region 1100S on the first region 1100F. Alternatively, the first region 1100F may be disposed at a side of the second region 1100S. The first region 1100F may be a peripheral circuit region including a decoder circuit 1110, a page buffer 1120, and/or a logic circuit 1130. The second region 1100S may be a memory cell region including bit lines BL, a common source line CSL, word lines WL, first lines LL1 and LL2, second lines UL1 and UL2, and/or memory cell strings CSTR between the common source line CSL and the bit lines BL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed.

For example, the first transistors LT1 and LT2 may include a ground selection transistor, and the second transistors UT1 and UT2 may include a string selection transistor. The first lines LL1 and LL2 may be gate electrodes of the first transistors LT1 and LT2, respectively. The word lines WL may be gate electrodes of the memory cell transistors MCT. The second lines UL1 and UL2 may be gate electrodes of the second transistors UT1 and UT2, respectively.

For example, the first transistors LT1 and LT2 may include a first erase control transistor LT1 and a ground selection transistor LT2, which are connected in series to each other. The second transistors UT1 and UT2 may include a string selection transistor UT1 and a second erase control transistor UT2, which are connected in series to each other. At least one of the first erase control transistor LT1 or the second erase control transistor UT2 may be used in an erase operation of erasing data stored in the memory cell transistors MCT by using a gate induced drain leakage (GIDL) phenomenon.

The common source line CSL, the first lines LL1 and LL2, the word lines WL and the second lines UL1 and UL2 may be electrically connected to the decoder circuit 1110 through first connection lines 1115 extending from the inside of the first region 1100F into the second region 1100S. The bit lines BL may be electrically connected to the page buffer 1120 through second connection lines 1125 extending from the inside of the first region 1100F into the second region 1100S.

In the first region 1100F, the decoder circuit 1110 and the page buffer 1120 may perform a control operation on at least one selected from the plurality of memory cell transistors MCT. The decoder circuit 1110 and the page buffer 1120 may be controlled by the logic circuit 1130. The 3D semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 extending from the inside of the first region 1100F into the second region 1100S.

The controller 1200 may include a processor 1210, a NAND controller 1220, and/or a host interface 1230. For example, the electronic system 1000 may include a plurality of the 3D semiconductor memory devices 1100, and the controller 1200 may control the plurality of 3D semiconductor memory devices 1100.

The processor 1210 may control overall operations of the electronic system 1000 including the controller 1200. The processor 1210 may operate according to predetermined or alternatively, desired firmware and may control the NAND controller 1220 to access the 3D semiconductor memory device 1100. The NAND controller 1220 may include a NAND interface 1221 for processing communication with the 3D semiconductor memory device 1100. A control command for controlling the 3D semiconductor memory device 1100, data to be written in the memory cell transistors MCT of the 3D semiconductor memory device 1100, and data to be read from the memory cell transistors MCT of the 3D semiconductor memory device 1100 may be transmitted through the NAND interface 1221. The host interface 1230 may provide a communication function between the electronic system 1000 and an external host. When a control command is received from the external host through the host interface 1230, the processor 1210 may control the 3D semiconductor memory device 1100 in response to the control command.

Figure 2:
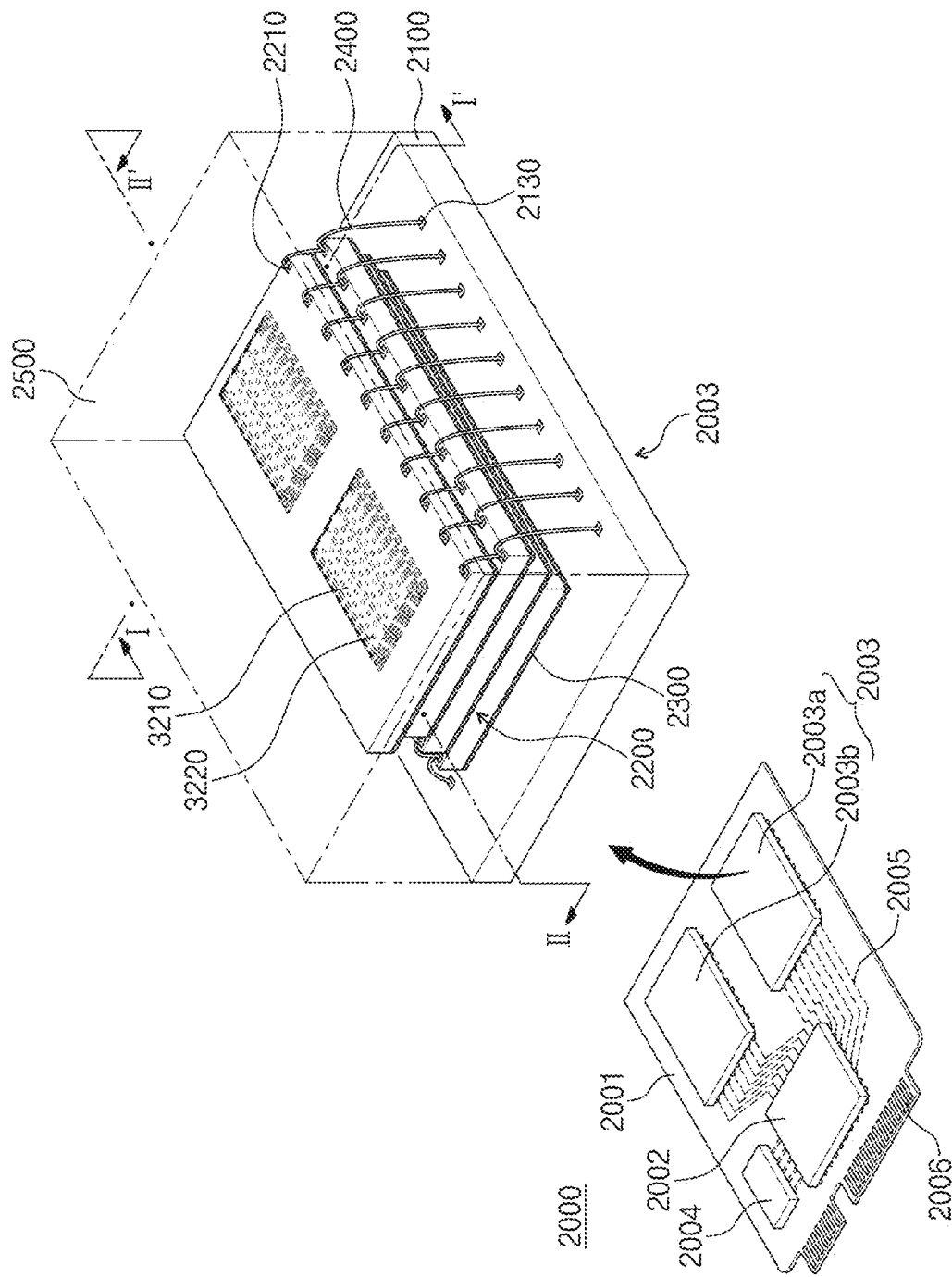
FIG. 2 is a perspective view schematically illustrating an electronic system including a 3D semiconductor memory device according to some example embodiments of the inventive concepts.

FIG. 2 is a perspective view schematically illustrating an electronic system including a 3D semiconductor memory device according to some example embodiments of the inventive concepts.

Referring to FIG. 2, an electronic system 2000 according to some example embodiments of the inventive concepts may include a main board 2001, a controller 2002, at least one or more semiconductor packages 2003, and/or a DRAM 2004. The controller 2002, the at least one or more semiconductor packages 2003 and/or the DRAM 2004 may be mounted on the main board 2001. The semiconductor package 2003 and the DRAM 2004 may be electrically connected to the controller 2002 through wiring patterns 2005 provided at the main board 2001.

The main board 2001 may include a connector 2006 including a plurality of pins coupled to an external host. The number and arrangement of the plurality of pins in the connector 2006 may be changed according to a communication interface between the electronic system 2000 and the external host. For example, the electronic system 2000 may communicate with the external host through one of a universal serial bus (USB) interface, a peripheral component interconnect express (PCI-express) interface, a serial advanced technology attachment (SATA) interface, and a M-Phy interface for a universal flash storage (UFS). For example, the electronic system 2000 may operate by power supplied from the external host through the connector 2006. The electronic system 2000 may further include a power management integrated circuit (PMIC) for distributing the power supplied from the external host to the controller 2002 and the semiconductor package 2003.

The controller 2002 may write data in the semiconductor package 2003 and/or read data from the semiconductor package 2003 and may improve an operation speed of the electronic system 2000.

The DRAM 2004 may be a buffer memory for reducing a speed difference between the external host and the semiconductor package 2003 corresponding to a data storage space. The DRAM 2004 included in the electronic system 2000 may also operate as a cache memory and may provide a space for temporarily storing data in an operation of controlling the semiconductor package 2003. In example embodiments in which the electronic system 2000 includes the DRAM 2004, the controller 2002 may further include a DRAM controller for controlling the DRAM 2004 in addition to a NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 disposed on bottom surfaces of the semiconductor chips 2200, respectively, a connection structure 2400 electrically connecting the semiconductor chips 2200 to the package substrate 2100, and/or a molding layer 2500 covering the semiconductor chips 2200 and the connection structure 2400 on the package substrate 2100.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a 3D semiconductor memory device as described later.

For example, the connection structure 2400 may include bonding wires electrically connecting the input/output pads 2210 to the package upper pads 2130. In each of the first and second semiconductor packages 2003*a* and 2003*b*, the semiconductor chips 2200 may be electrically connected to each other by the bonding wire method and may be electrically connected to the package upper pads 2130 of the package substrate 2100 by the bonding wire method. According to certain example embodiments, in each of the first and second semiconductor packages 2003*a* and 2003*b*, the semiconductor chips 2200 may be electrically connected to each other by through-silicon vias (TSVs), instead of the connection structure 2400 including the bonding wires.

In certain example embodiments, the controller 2002 and the semiconductor chips 2200 may be included in a single package. For example, the controller 2002 and the semiconductor chips 2200 may be mounted on an interposer substrate different from the main board 2001, and the controller 2002 and the semiconductor chips 2200 may be connected to each other by wiring lines provided at the interposer substrate.

Figure 3:
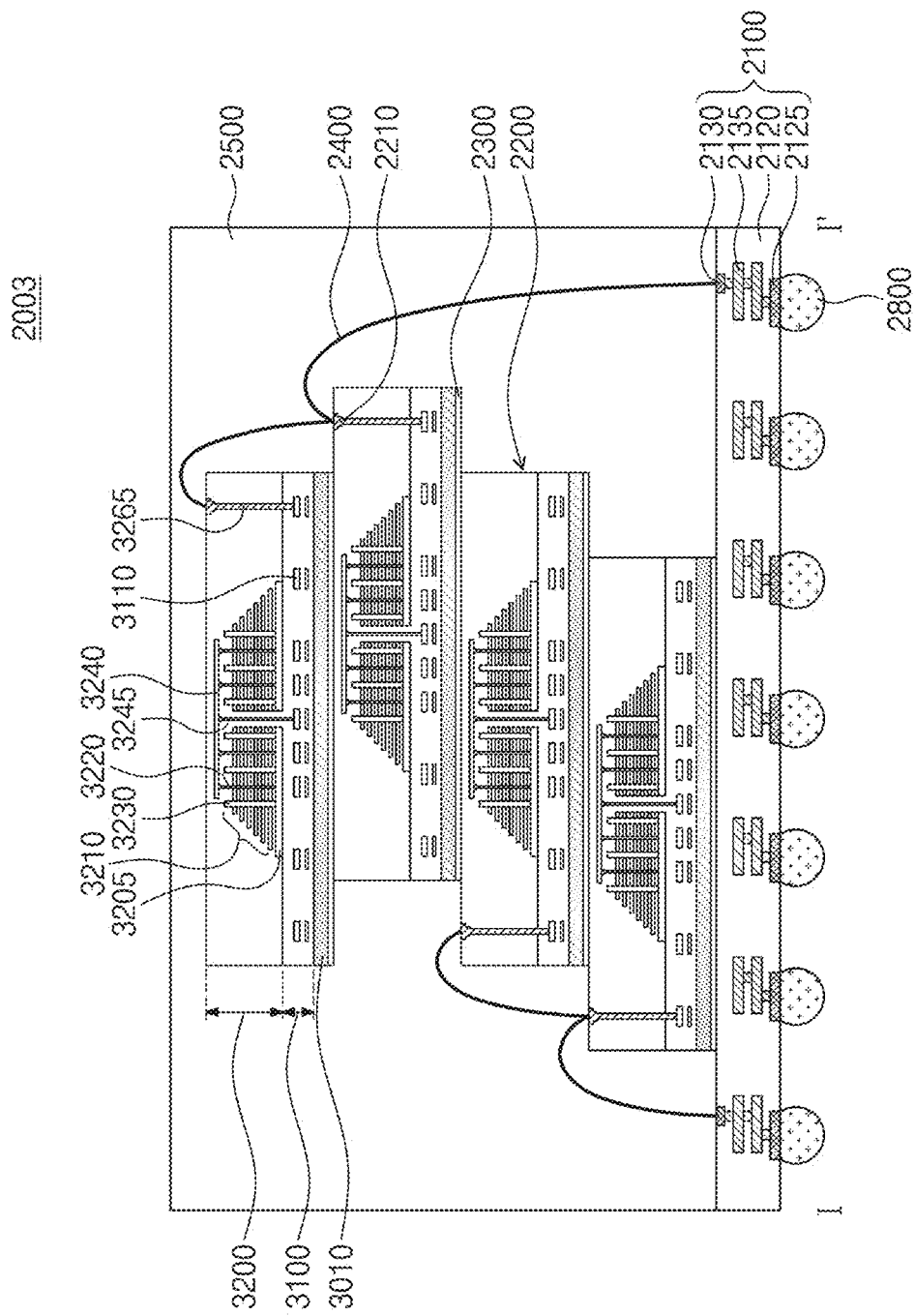
FIGS. 3 and 4 are cross-sectional views taken along lines I-I' and II-II' of FIG. 2, respectively, to illustrate a semiconductor package including a 3D semiconductor memory device according to some example embodiments of the inventive concepts.
Figure 4:
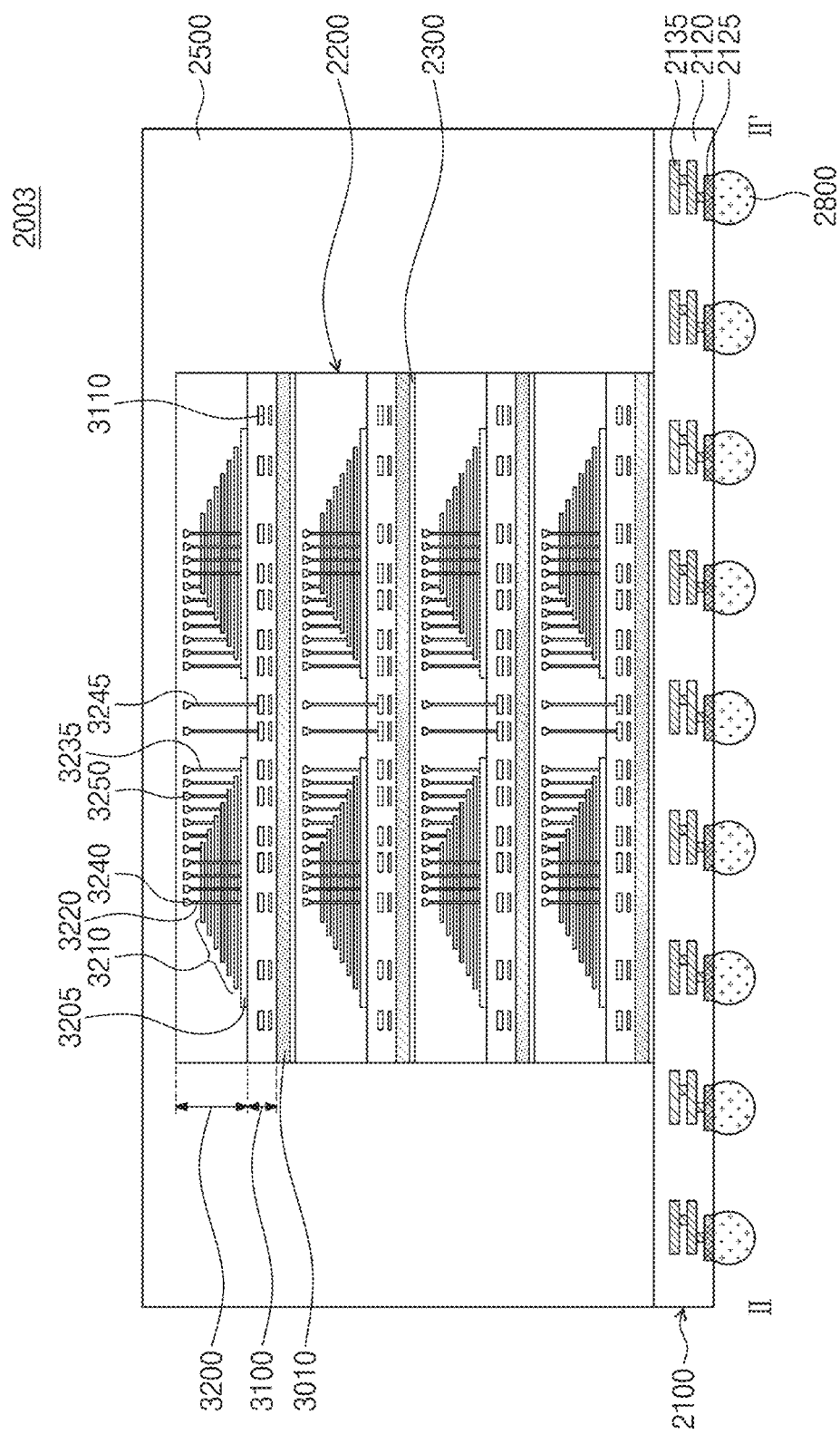

FIGS. 3 and 4 are cross-sectional views taken along lines I-I' and II-II' of FIG. 2, respectively, to illustrate a semiconductor package including a 3D semiconductor memory device according to some example embodiments of the inventive concepts.

Referring to FIGS. 3 and 4, the semiconductor package 2003 may include the package substrate 2100, a plurality of the semiconductor chips 2200 on the package substrate 2100, and/or the molding layer 2500 covering the package substrate 2100 and the plurality of semiconductor chips 2200.

The package substrate 2100 may include a package substrate body portion 2120, the package upper pads 2130 disposed at a top surface of the package substrate body portion 2120, package lower pads 2125 disposed at a bottom surface of the package substrate body portion 2120 or exposed through the bottom surface, and/or internal wiring lines 2135 disposed in the package substrate body portion 2120 to electrically connect the package upper pads 2130 to the package lower pads 2125. The package upper pads 2130 may be electrically connected to the connection structures 2400. The package lower pads 2125 may be electrically connected to the wiring patterns 2005 of the main board 2001 of the electronic system 2000 of FIG. 2 through conductive connection parts 2800.

Each of the semiconductor chips 2200 may include a semiconductor substrate 3010, and first and second structures 3100 and 3200 sequentially stacked on the semiconductor substrate 3010. The first structure 3100 may include a peripheral circuit region including peripheral wiring lines 3110. The second structure 3200 may include a common source line 3205; a gate stack structure 3210 on the common source line 3205; vertical channel structures 3220 and separation structures 3230 which penetrate the gate stack structure 3210; bit lines 3240 electrically connected to the vertical channel structures 3220; and gate connection lines 3235 and conductive lines 3250 which are electrically connected to word lines (see WL of FIG. 1) of the gate stack structure 3210.

Each of the semiconductor chips 2200 may include a through-wiring line 3245 which is electrically connected to the peripheral wiring line 3110 of the first structure 3100 and extends into the second structure 3200. The through-wiring line 3245 may penetrate the gate stack structure 3210. An additional through-wiring line 3245 may be disposed outside the gate stack structure 3210. Each of the semiconductor chips 2200 may further include an input/output connection line 3265 and an input/output pad 2210 electrically connected to the input/output connection line 3265. The input/output connection line 3265 may be electrically connected to the peripheral wiring line 3110 of the first structure 3100 and may extend into the second structure 3200.

Figure 5:
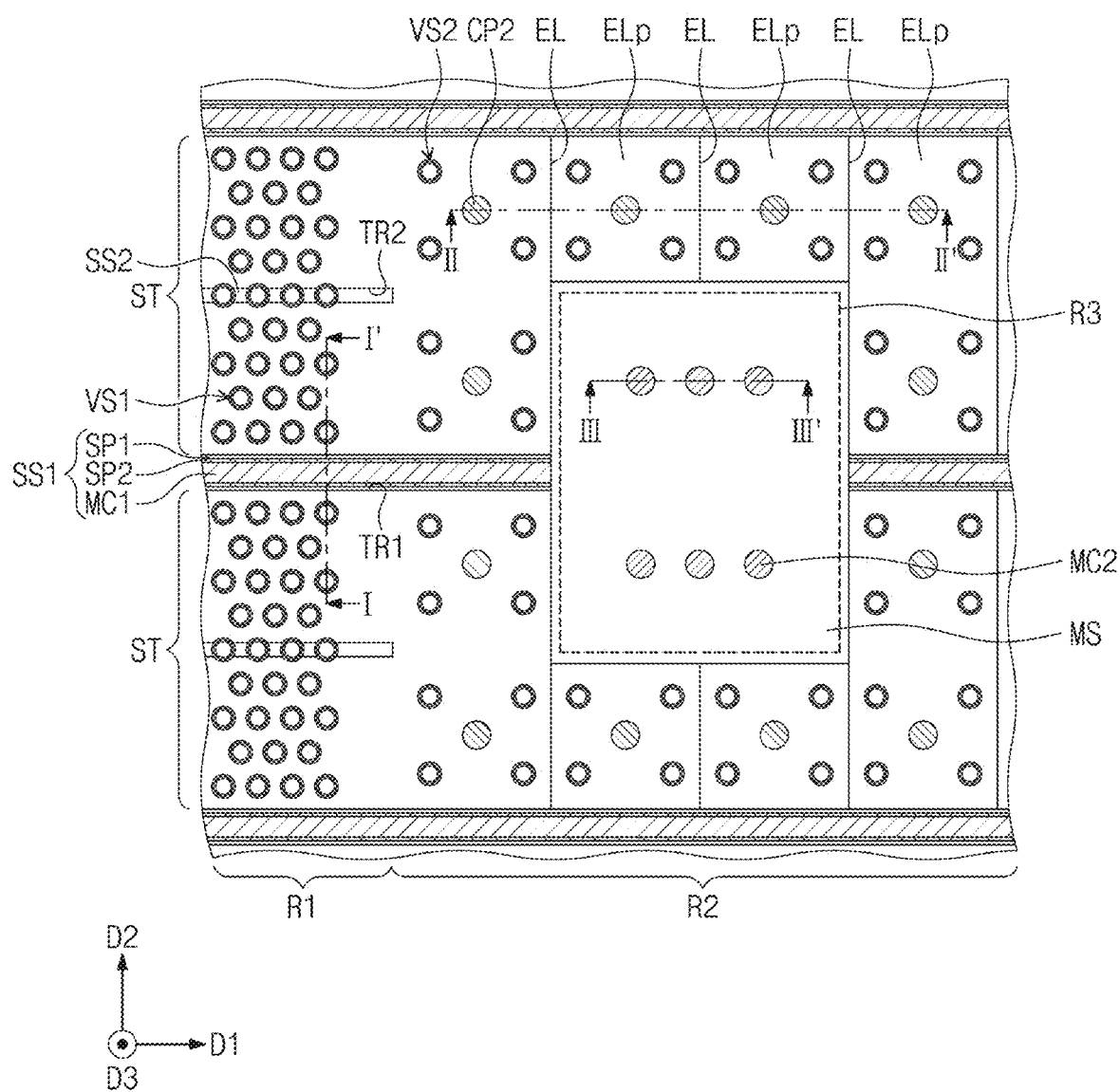
FIG. 5 is a plan view illustrating a 3D semiconductor memory device according to some example embodiments of the inventive concepts.
Figure 6:
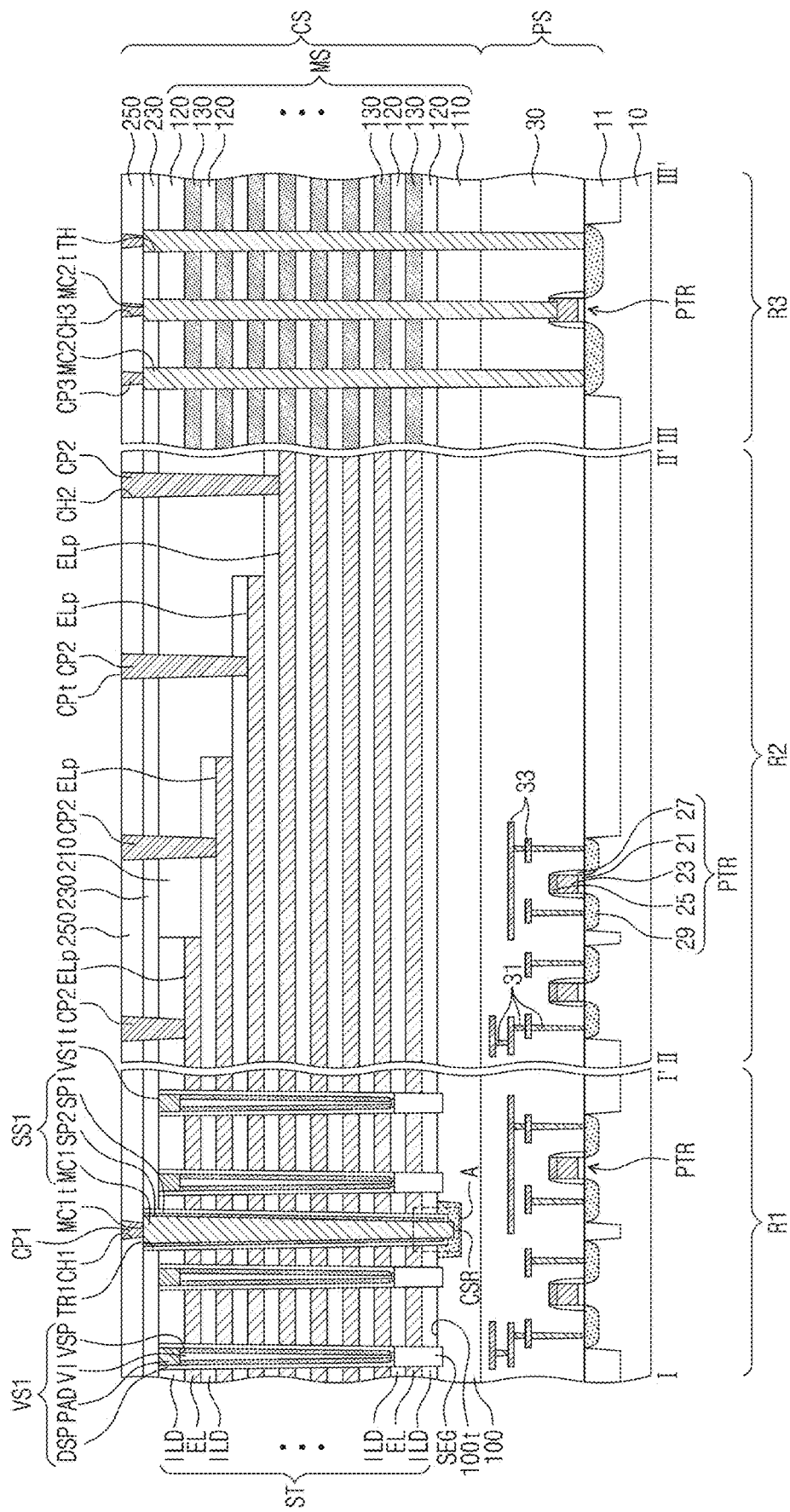
FIG. 6 is a cross-sectional view taken along lines I-I', II-II' and III-III' of FIG. 5 to illustrate a 3D semiconductor memory device according to some example embodiments of the inventive concepts.

FIG. 5 is a plan view illustrating a 3D semiconductor memory device according to some example embodiments of the inventive concepts. FIG. 6 is a cross-sectional view taken along lines I-I', II-II' and III-III' of FIG. 5 to illustrate a 3D semiconductor memory device according to some example embodiments of the inventive concepts.

Referring to FIGS. 5 and 6, a 3D semiconductor memory device according to some example embodiments of the inventive concepts may include a first substrate 10, a peripheral circuit structure PS on the first substrate 10, and a cell array structure CS on the peripheral circuit structure PS. The first substrate 10, the peripheral circuit structure PS and the cell array structure CS may correspond to the semiconductor substrate 3010, the first structure 3100 on the semiconductor substrate 3010 and the second structure 3200 on the first structure 3100 in FIGS. 3 and 4, respectively.

The first substrate 10 including a first region R1, a second region R2 and a third region R3 may be provided. The second region R2 may extend from a side of the first region R1 in a first direction D1. As illustrated in FIG. 5, the third region R3 may be surrounded by the second region R2 when viewed in a plan view. The first region R1 may be a region on which the vertical channel structures 3220, the separation structures 3230 and/or the bit lines 3240 electrically connected to the vertical channel structures 3220 in FIGS. 3 and 4 are provided. The second region R2 may be a region on which a staircase structure including pad portions ELp to be described later is provided. The third region R3 may be a region on which a mold structure MS to be described later is provided.

The first substrate 10 may extend in the first direction D1 and a second direction D2 intersecting the first direction D1. A top surface of the first substrate 10 may be perpendicular to a third direction D3 intersecting the first direction D1 and the second direction D2. For example, the first direction D1, the second direction D2 and the third direction D3 may be perpendicular to each other.

For example, the first substrate 10 may include a silicon substrate, a silicon-germanium substrate, a germanium substrate, or a monocrystalline epitaxial layer grown on a monocrystalline silicon substrate.

A device isolation layer 11 may be provided in the first substrate 10. The device isolation layer 11 may define active regions of the first substrate 10. The device isolation layer 11 may include, for example, silicon oxide.

The peripheral circuit structure PS may be provided on the first substrate 10. The peripheral circuit structure PS may include peripheral circuit transistors PTR on the active regions of the first substrate 10, peripheral contact plugs 31, peripheral circuit wiring lines 33 electrically connected to the peripheral circuit transistors PTR through the peripheral contact plugs 31, and/or a first insulating layer 30 surrounding them. The peripheral circuit structure PS may correspond to the first region 1100F of FIG. 1, and the peripheral circuit wiring lines 33 may correspond to the peripheral wiring lines 3110 of FIGS. 3 and 4.

The peripheral circuit transistors PTR, the peripheral contact plugs 31 and/or the peripheral circuit wiring lines 33 may constitute a peripheral circuit. For example, the peripheral circuit transistors PTR may constitute the decoder circuit 1110, the page buffer 1120 and the logic circuit 1130 of FIG. 1. Each of the peripheral circuit transistors PTR may include a peripheral gate insulating layer 21, a peripheral gate electrode 23, a peripheral capping pattern 25, a peripheral gate spacer 27, and/or peripheral source/drain regions 29.

The peripheral gate insulating layer 21 may be provided between the peripheral gate electrode 23 and the first substrate 10. The peripheral capping pattern 25 may be provided on the peripheral gate electrode 23. The peripheral gate spacer 27 may cover sidewalls of the peripheral gate insulating layer 21, the peripheral gate electrode 23 and the peripheral capping pattern 25. The peripheral source/drain regions 29 may be provided in the first substrate 10 (e.g., the active region) at both sides of the peripheral gate electrode 23.

The peripheral circuit wiring lines 33 may be electrically connected to the peripheral circuit transistors PTR through the peripheral contact plugs 31. For example, each of the peripheral circuit transistors PTR may be an NMOS transistor, a PMOS transistor, or a gate-all-around (GAA) type transistor. For example, a width of the peripheral contact plug 31 in the first direction D1 or the second direction D2 may increase as a level from the first substrate 10 increases. The peripheral contact plugs 31 and the peripheral circuit wiring lines 33 may include a conductive material such as a metal.

The first insulating layer 30 may be provided on the top surface of the first substrate 10. The first insulating layer 30 may cover the peripheral circuit transistors PTR, the peripheral contact plugs 31 and the peripheral circuit wiring lines 33 on the first substrate 10. The first insulating layer 30 may include a plurality of stacked insulating layers. For example, the first insulating layer 30 may include an insulating material such as silicon oxide, silicon nitride, silicon oxynitride, and/or a low-k dielectric material.

The cell array structure CS including a second substrate 100, a stack structure ST and/or a mold structure MS may be provided on the first insulating layer 30. The second substrate 100 may extend in the first direction D1 and the second direction D2. The second substrate 100 may be provided on the first region R1 and the second region R2 but may not be provided on the third region R3. The second substrate 100 may be a semiconductor substrate including a semiconductor material. For example, the second substrate 100 may include at least one of silicon (Si), germanium (Ge), silicon-germanium (SiGe), gallium-arsenic (GaAs), indium-gallium-arsenic (InGaAs), or aluminum-gallium-arsenic (AlGaAs).

The stack structure ST may be provided on the second substrate 100. The stack structure ST may extend from the first region R1 onto the second region R2. The stack structure ST may correspond to the gate stack structure 3210 of FIGS. 3 and 4. The stack structure ST may be provided in plurality. The plurality of stack structures ST may be arranged in the second direction D2 and may be spaced apart from each other in the second direction D2 with a first separation structure SS1, to be described later, interposed therebetween. One of the stack structures ST will be described hereinafter for the purpose of ease and convenience in explanation. However, the following descriptions may also be applied to other stack structures ST.

The stack structure ST may include interlayer dielectric layers ILD and gate electrodes EL, which are alternately and repeatedly stacked. The gate electrodes EL may correspond to the word lines WL, the first lines LL1 and LL2 and the second lines UL1 and UL2 of FIG. 1.

Thicknesses of the gate electrodes EL in the third direction D3 may be substantially equal to each other. Hereinafter, the term 'thickness' will mean a thickness in the third direction D3.

Lengths of the gate electrodes EL in the first direction D1 may sequentially decrease as a level from the second substrate 100 (e.g., a level in the third direction D3) increases. In other words, the length, in the first direction D1, of each of the gate electrodes EL may be greater than the length, in the first direction D1, of another gate electrode located directly on each of the gate electrodes EL. A lowermost one of the gate electrodes EL may have the greatest length in the first direction D1, and an uppermost one of the gate electrodes EL may have the smallest length in the first direction D1.

The gate electrodes EL may have pad portions ELp on the second region R2. The pad portions ELp of the gate electrodes EL may be disposed at positions horizontally and vertically different from each other. The pad portions ELp may constitute a staircase structure along the first direction D1.

Due to the staircase structure, a thickness of the stack structure ST may decrease as a distance from an outermost one of first vertical channel structures VS1 to be described later increases, and sidewalls of the gate electrodes EL may be spaced apart from each other at equal intervals in the first direction D1 when viewed in a plan view.

For example, the gate electrodes EL may include at least one of a doped semiconductor material (e.g., doped silicon), a metal (e.g., tungsten, copper, or aluminum), a conductive metal nitride (e.g., titanium nitride or tantalum nitride), or a transition metal (e.g., titanium or tantalum). In particular, the gate electrodes EL may include tungsten.

The interlayer dielectric layers ILD may be provided between the gate electrodes EL. A sidewall of each of the interlayer dielectric layers ILD may be aligned with a sidewall of the gate electrode EL being in contact with a bottom surface of each of the interlayer dielectric layers ILD. In other words, like the gate electrodes EL, lengths of the interlayer dielectric layers ILD in the first direction D1 may sequentially decrease as a level from the second substrate 100 increases.

A thickness of each of the interlayer dielectric layers ILD may be less than the thickness of each of the gate electrodes EL. For example, the thickness of a lowermost one of the interlayer dielectric layers ILD may be less than the thickness of each of other interlayer dielectric layers ILD. For example, the thickness of an uppermost one of the interlayer dielectric layers ILD may be greater than the thickness of each of other interlayer dielectric layers ILD. The thicknesses of the interlayer dielectric layers ILD between the lowermost interlayer dielectric layer ILD and the uppermost interlayer dielectric layer ILD may be substantially equal to each other. However, example embodiments of the inventive concepts are not limited thereto. The thicknesses of the interlayer dielectric layers ILD may be changed depending on characteristics of the 3D semiconductor memory device.

For example, the interlayer dielectric layers ILD may include silicon oxide, silicon nitride, silicon oxynitride, and/or low-k dielectric material. For example, the interlayer dielectric layers ILD may include a high-density plasma (HDP) oxide, or tetraethylorthosilicate (TEOS).

The mold structure MS may be provided on the first insulating layer 30 of the third region R3. The mold structure MS may be locally provided on the third region R3 but may not be provided on the first region R1 and the second region R2. A top surface of the mold structure MS may be located at the same or substantially the same level as a topmost surface of the stack structure ST. However, example embodiments of the inventive concepts are not limited thereto. In certain example embodiments, the top surface of the mold structure MS may be located at the same level as the pad portion ELp of the gate electrode EL adjacent thereto (e.g., may be located at a level lower than the topmost surface of the stack structure ST).

The mold structure MS may include a second insulating layer 110, and first mold layers 120 and second mold layers 130 which are alternately and repeatedly stacked on the second insulating layer 110. The second insulating layer 110 may be locally provided on only the third region R3. The second insulating layer 110 may overlap with the second substrate 100 in a horizontal direction. In other words, top and bottom surfaces of the second insulating layer 110 may be located at the same or substantially the same levels as top and bottom surfaces of the second substrate 100, respectively.

The first mold layers 120 may overlap with the interlayer dielectric layers ILD of the stack structure ST in the horizontal direction, respectively. In other words, top and bottom surfaces of each of the first mold layers 120 may be located at the same or substantially the same levels as top and bottom surfaces of a corresponding one of the interlayer dielectric layers ILD, respectively. The second mold layers 130 may overlap with the gate electrodes EL of the stack structure ST in the horizontal direction, respectively. In other words, top and bottom surfaces of each of the second mold layers 130 may be located at the same or substantially the same levels as top and bottom surfaces of a corresponding one of the gate electrodes EL, respectively.

The second insulating layer 110 may include a single insulating layer or a plurality of stacked insulating layers. For example, the second insulating layer 110 may include an insulating material such as silicon oxide, silicon nitride, silicon oxynitride, and/or a low-k dielectric material. The first mold layers 120 may include the same material as the interlayer dielectric layers ILD of the stack structure ST. The first mold layers 120 may include, for example, silicon oxide, and the second mold layers 130 may include, for example, silicon nitride.

A plurality of first vertical channel structures VS1 may be provided to penetrate the stack structure ST on the first region RE The first vertical channel structures VS1 may penetrate at least a portion of the second substrate 100, and a bottom surface of each of the first vertical channel structures VS1 may be located at a level lower than a top surface 100t of the second substrate 100. In other words, the first vertical channel structures VS1 may be in direct contact with the second substrate 100.

As illustrated in FIG. 5, the first vertical channel structures VS1 may be arranged in a zigzag form in the first direction D1 or the second direction D2 when viewed in a plan view. For example, each of top surfaces VS1t of the first vertical channel structures VS1 may have a circular, elliptical or bar shape when viewed in a plan view. The first vertical channel structures VS1 may not be provided on the second region R2 and the third region R3. The first vertical channel structures VS1 may correspond to the vertical channel structures 3220 of FIGS. 2 to 4. The first vertical channel structures VS1 may correspond to channel regions of the first transistors LT1 and LT2, the memory cell transistors MCT and the second transistors UT1 and UT2 of FIG. 1.

The first vertical channel structures VS1 may be provided in vertical channel holes penetrating the stack structure ST. A width, in the first direction D1 or the second direction D2, of each of the first vertical channel structures VS1 (e.g., the vertical channel holes) may increase as a level in the third direction D3 increases.

In some example embodiments, each of the first vertical channel structures VS1 may include at least one portion of which a width in the first direction D1 or the second direction D2 is discontinuously changed. However, example embodiments of the inventive concepts are not limited thereto. In certain example embodiments, each of the first vertical channel structures VS1 may not include the portion having the discontinuously changed width, and a sidewall of each of the first vertical channel structures VS1 may be substantially flat.

Each of the first vertical channel structures VS1 may include an epitaxial layer SEG, a data storage pattern DSP, a vertical semiconductor pattern VSP, a filling insulation pattern VI, and/or a conductive pad PAD.

The epitaxial layer SEG may fill a lower portion of each of the vertical channel holes, and an upper portion of the epitaxial layer SEG may be connected to the data storage pattern DSP and the vertical semiconductor pattern VSP. At least a portion of the epitaxial layer SEG may be buried in the second substrate 100. In other words, a bottom surface of the epitaxial layer SEG may be located at a level lower than the top surface 100t of the second substrate 100. The vertical semiconductor pattern VSP may be electrically connected to the second substrate 100 through the epitaxial layer SEG. The epitaxial layer SEG may include a semiconductor material formed by a selective epitaxial growth method. However, example embodiments of the inventive concepts are not limited thereto. In certain example embodiments, each of the first vertical channel structures VS1 may not include the epitaxial layer SEG, and the vertical semiconductor pattern VSP may be connected directly to the second substrate 100.

The data storage pattern DSP may conformally cover an inner sidewall of each of the vertical channel holes. In other words, the data storage pattern DSP may be adjacent to the stack structure ST and may cover sidewalls of the interlayer dielectric layers ILD and sidewalls of the gate electrodes EL. At least a portion of the data storage pattern DSP may cover a top surface of the epitaxial layer SEG and may extend in the horizontal direction. The data storage pattern DSP may have a pipe shape or macaroni shape (i.e. hollow cylinder shape) of which a bottom end is opened.

The data storage pattern DSP may include a plurality of insulating layers sequentially stacked on the inner sidewall of each of the vertical channel holes. For example, the data storage pattern DSP may include a blocking insulating layer, a charge storage layer and a tunneling insulating layer, which are sequentially stacked on the inner sidewall of each of the vertical channel holes. The blocking insulating layer may be adjacent to the stack structure ST, and the tunneling insulating layer may be adjacent to the vertical semiconductor pattern VSP. The charge storage layer may be disposed between the blocking insulating layer and the tunneling insulating layer. The blocking insulating layer may cover the inner sidewall of each of the vertical channel holes.

Each of the blocking insulating layer, the charge storage layer and the tunneling insulating layer may extend in the third direction D3 between the stack structure ST and the vertical semiconductor pattern VSP. The data storage pattern DSP may store and/or change data by a Fowler-Nordheim tunneling phenomenon induced by a voltage difference between the vertical semiconductor pattern VSP and the gate electrodes EL. For example, the blocking insulating layer and the tunneling insulating layer may include silicon oxide, and the charge storage layer may include silicon nitride or silicon oxynitride.

The vertical semiconductor pattern VSP may conformally cover an inner sidewall of the data storage pattern DSP and the top surface of the epitaxial layer SEG. The vertical semiconductor pattern VSP may be provided between the data storage pattern DSP and the filling insulation pattern VI. The vertical semiconductor pattern VSP may have a pipe shape or macaroni shape (i.e. hollow cylinder shape) of which a bottom end is closed. For example, the vertical semiconductor pattern VSP may include a semiconductor material doped with dopants, an intrinsic semiconductor material not doped with dopants, or a poly-crystalline semiconductor material.

The filling insulation pattern VI may fill an inner space surrounded by the vertical semiconductor pattern VSP. The filling insulation pattern VI may be spaced apart from the epitaxial layer SEG in the third direction D3 with a portion of the vertical semiconductor pattern VSP interposed therebetween. The filling insulation pattern VI may include, for example, silicon oxide.

The conductive pad PAD may be provided in a space surrounded by the filling insulation pattern VI and the data storage pattern DSP. The conductive pad PAD may be electrically connected to an upper portion of the vertical semiconductor pattern VSP. A top surface of the conductive pad PAD may be substantially coplanar with the top surface of the stack structure ST. For example, the conductive pad PAD may include a semiconductor material doped with dopants, or a conductive material.

A plurality of second vertical channel structures VS2 may be provided to penetrate the stack structure ST on the second region R2. More particularly, the second vertical channel structures VS2 may penetrate the pad portions ELp of the gate electrodes EL. Some of the second vertical channel structures VS2 may also penetrate a third insulating layer 210 covering the pad portions ELp.

The second vertical channel structures VS2 may be provided around second contact plugs CP2 to be described later. The second vertical channel structures VS2 may not be provided on the first region R1 and the third region R3. The second vertical channel structures VS2 may be formed simultaneously with the first vertical channel structures VS1 and may have the same or substantially the same structure as the first vertical channel structures VS1. However, in certain example embodiments, the second vertical channel structures VS2 may be omitted.

A third insulating layer 210 may be provided to cover the staircase structure of the stack structure ST on the second region R2. The third insulating layer 210 may be provided on the pad portions ELp of the gate electrodes EL. The third insulating layer 210 may have a substantially flat top surface. A top surface of the third insulating layer 210 may be substantially coplanar with the topmost surface of the stack structure ST. For example, the third insulating layer 210 may include an insulating material such as silicon oxide, silicon nitride, silicon oxynitride, and/or a low-k dielectric material. For example, the third insulating layer 210 may include a different insulating material from that of the interlayer dielectric layers ILD of the stack structure ST. For example, when the interlayer dielectric layers ILD of the stack structure ST include a high-density plasma (HDP) oxide, the third insulating layer 210 may include TEOS.

A fourth insulating layer 230 may be provided to cover the stack structure ST and the mold structure MS on the first region R1, the second region R2 and the third region R3. The fourth insulating layer 230 may extend from the first region R1 onto the second region R2 and the third region R3 and may have a substantially flat top surface. The fourth insulating layer 230 may cover a top surface of the uppermost one of the interlayer dielectric layers ILD of the stack structure ST and the top surfaces VS1t of the first vertical channel structures VS1 on the first region R1. The fourth insulating layer 230 may cover the staircase structure of the stack structure ST on the second region R2. The fourth insulating layer 230 may cover a top surface of an uppermost one of the first mold layers 120 of the mold structure MS on the third region R3. Unlike FIG. 6, a portion of the third insulating layer 210 described above may be disposed between the fourth insulating layer 230 and the uppermost one of the first mold layers 120 of the mold structure MS. For example, the fourth insulating layer 230 may include an insulating material such as silicon oxide, silicon nitride, silicon oxynitride, and/or a low-k dielectric material.

When the stack structure ST is provided in plurality, a first separation structure SS1 may be provided in a first trench TR1 extending in the first direction D1 between the plurality of stack structures ST. The first separation structure SS1 may extend from the first region R1 onto the second region R2 and may not be provided on the third region R3. A top surface of the first separation structure SS1 may have a line shape when viewed in a plan view, as illustrated in FIG. 5. The first separation structure SS1 may be spaced apart from the first and second vertical channel structures VS1 and VS2 and second contact plugs CP2 to be described later in the second direction D2. For example, the top surface of the first separation structure SS1 may be located at a higher level than top surfaces of the first and second vertical channel structures VS1 and VS2. A bottom surface of the first separation structure SS1 may be located at a level lower than the top surface 100t of the second substrate 100. For example, a width of the first separation structure SS1 in the second direction D2 may increase as a level in the third direction D3 increases.

The first separation structure SS1 may be provided in plurality, and the plurality of first separation structures SS1 may be spaced apart from each other in the second direction D2 with the stack structure ST interposed therebetween. The first separation structures SS1 may correspond to the separation structures 3230 of FIGS. 3 and 4.

The first separation structure SS1 may include a first spacer SP1 and a second spacer SP2 which sequentially cover an inner sidewall of the first trench TR1, and a first conductive contact MC1 completely filling an inner space of the first trench TR1 surrounded by the second spacer SP2. The first spacer SP1 may conformally cover the inner sidewall of the first trench TR1. The second spacer SP2 may be disposed between the first spacer SP1 and the first conductive contact MC1 and may conformally cover a sidewall of the first spacer SP1. A top surface MC1t of the first conductive contact MC1 may be substantially coplanar with a top surface of the fourth insulating layer 230.

A common source region CSR may be provided in an upper portion of the second substrate 100, which overlaps with the first separation structure SS1 in the third direction D3. The common source region CSR may be located in the second substrate 100 exposed by the first trench TR1. The common source region CSR may extend in the first direction D1 in the second substrate 100. For example, the common source region CSR may include a semiconductor material doped with dopants having a different conductivity type from that of the second substrate 100. The first conductive contact MC1 of the first separation structure SS1 may be in direct contact with the common source region CSR. The common source region CSR may correspond to the common source line CSL of FIG. 1 or the common source line 3205 of FIGS. 3 and 4.

A second separation structure SS2 may be provided in a second trench TR2 intersecting the stack structure ST in the first direction D1. A top surface of the second separation structure SS2 may have a line shape when viewed in a plan view, as illustrated in FIG. 5. The second separation structure SS2 may be locally provided on only the first region R1. A length of the second separation structure SS2 in the first direction D1 may be less than a length of the first separation structure SS1 in the first direction D1. A width of the second separation structure SS2 in the second direction D2 may be less than a width of the first separation structure SS1 in the second direction D2. The second separation structure SS2 may overlap with some of the first vertical channel structures VS1 and may be in contact with the some of the first vertical channel structures VS1. For example, the second separation structure SS2 may include silicon oxide.

Second conductive contacts MC2 may be provided in through-holes TH penetrating the fourth insulating layer 230, the mold structure MS, the second insulating layer 110 and the first insulating layer 30 on the third region R3. Some of the second conductive contacts MC2 may be in contact with the peripheral source/drain regions 29 of some of the peripheral circuit transistors PTR provided on the third region R3. Others of the second conductive contacts MC2 may be in contact with the peripheral gate electrodes 23 of some of the peripheral circuit transistors PTR provided on the third region R3. For example, each of top surfaces MC2t of the second conductive contacts MC2 may have a circular or elliptical shape when viewed in a plan view. For example, a width of the second conductive contact MC2 in the first direction D1 or the second direction D2 may increase as a level in the third direction D3 increases.

The top surfaces MC2t of the second conductive contacts MC2 may be located at the same or substantially the same level as the top surface MC1t of the first conductive contact MC1 (e.g., the top surface of the first separation structure SS1). For example, the top surfaces MC1t and MC2t of the first and second conductive contacts MC1 and MC2 may be located at a higher level than the top surfaces VS1t of the first vertical channel structures VS1. Bottom surfaces of the second conductive contacts MC2 may be located at level lowers than the bottom surface of the first conductive contact MC1 and a bottom surface of the second insulating layer 110. A height of each of the second conductive contacts MC2 in the third direction D3 may be greater than a height of the first conductive contact MC1 in the third direction D3. The first and second conductive contacts MC1 and MC2 may include a conductive material such as a metal.

A fifth insulating layer 250 may be provided to cover the fourth insulating layer 230 on the first region R1, the second region R2 and the third region R3. The fifth insulating layer 250 may extend from the first region R1 onto the second region R2 and the third region R3 and may have a substantially flat top surface. The fifth insulating layer 250 may cover the top surface MC1t of the first conductive contact MC1 of the first separation structure SS1 on the first region R1. The fifth insulating layer 250 may cover the top surfaces MC2t of the second conductive contacts MC2 on the third region R3. For example, the fifth insulating layer 250 may include an insulating material such as silicon oxide, silicon nitride, silicon oxynitride, and/or a low-k dielectric material.

A first contact plug CP1 may be provided in a first contact hole CH1 penetrating the fifth insulating layer 250 on the first region R1. The first contact plug CP1 may be in contact with the first conductive contact MC1 of the first separation structure SS1. A width of a lower portion of the first contact plug CP1 may be different from a width of an upper portion of the first conductive contact MC1. For example, the width of the lower portion of the first contact plug CP1 may be less than the width of the upper portion of the first conductive contact MC1. An average grain size of the first contact plug CP1 may be different from an average grain size of the first conductive contact MC1.

Second contact plugs CP2 may be provided in second contact holes CH2 penetrating the fifth insulating layer 250, the fourth insulating layer 230 and at least a portion of the stack structure ST on the second region R2. At least some of the second contact holes CH2 may also penetrate the third insulating layer 210. The second contact plugs CP2 may be in contact with the pad portions ELp of the gate electrodes EL. Heights of the second contact plugs CP2 in the third direction D3 may be greater than a height of the first contact plug CP1 in the third direction D3 and heights of third contact plugs CP3 in the third direction D3.

The third contact plugs CP3 may be provided in third contact holes CH3 penetrating the fifth insulating layer 250 on the third region R3. The third contact plugs CP3 may be in contact with the second conductive contacts MC2. A width of a lower portion of each of the third contact plugs CP3 may be different from a width of an upper portion of each of the second conductive contacts MC2. For example, the width of the lower portion of each of the third contact plugs CP3 may be less than the width of the upper portion of each of the second conductive contacts MC2. An average grain size of the third contact plugs CP3 may be different from an average grain size of the second conductive contacts MC2.

Top surfaces CPt of the first to third contact plugs CP1, CP2 and CP3 may be located at the same or substantially the same level. More particularly, the top surfaces CPt of the first to third contact plugs CP1, CP2 and CP3 may be substantially coplanar with a top surface of the fifth insulating layer 250 and may be located at a higher level than the top surface of the fourth insulating layer 230 and the top surfaces MC1t and MC2t of the first and second conductive contacts MC1 and MC2.

For example, a width of each of the first to third contact plugs CP1, CP2 and CP3 in the first direction D1 or the second direction D2 may increase as a level in the third direction D3 increases. The first to third contact plugs CP1, CP2 and CP3 may include a conductive material such as a metal. Even though not shown in the drawings, each of the first to third contact plugs CP1, CP2 and CP3 may further include a barrier metal layer on its bottom surface and sidewall, and the barrier metal layer may include a different material from that of the first and second conductive contacts MC1 and MC2.

Even though not shown in the drawings, a plurality of conductive lines connected to the first to third contact plugs CP1, CP2 and CP3 and additional wiring lines and additional vias connected to the conductive lines may further be provided on the fifth insulating layer 250.

Figure 7:
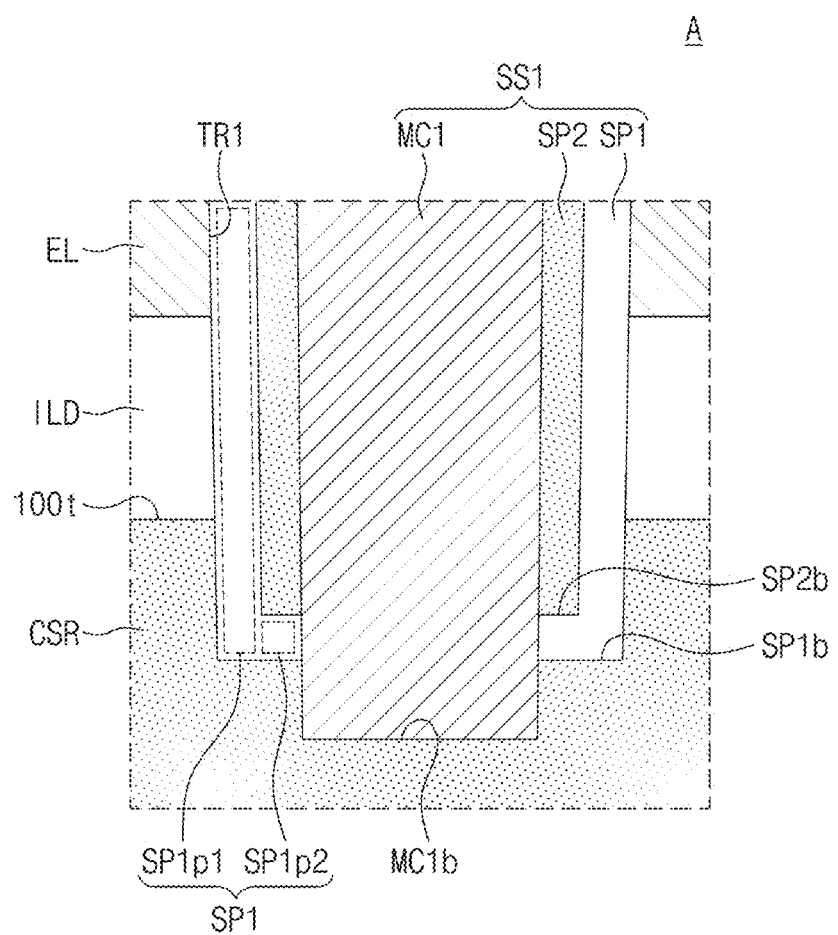
FIG. 7 is an enlarged view of a portion 'A' of FIG. 6 to illustrate a portion of a 3D semiconductor memory device according to some example embodiments of the inventive concepts.

FIG. 7 is an enlarged view of a portion 'A' of FIG. 6 to illustrate a portion of a 3D semiconductor memory device according to some example embodiments of the inventive concepts.

Referring to FIGS. 5, 6 and 7, the first spacer SP1 may include a first portion SP1p1 covering the inner sidewall of the first trench TR1 and extending in the third direction D3, and a second portion SP1p2 extending from the first portion SP1p1 in a horizontal direction. The second portion SP1p2 of the first spacer SP1 may be located between a bottom surface SP2b of the second spacer SP2 and the common source region CSR and may be in contact with a sidewall of the first conductive contact MC1. The second spacer SP2 may be spaced apart from the common source region CSR in the third direction D3 with the second portion SP1p2 of the first spacer SP1 interposed therebetween. The second portion SP1p2 of the first spacer SP1 may be located at a level lower than the top surface 100t of the second substrate 100.

A bottom surface MC1b of the first conductive contact MC1 may be located at a level lower than a bottom surface SP1b of the first spacer SP1 and may be in direct contact with the common source region CSR. The bottom surface SP1b of the first spacer SP1 may be located at a level lower than the bottom surface SP2b of the second spacer SP2. The bottom surface SP2b of the second spacer SP2 may be located at a level lower than the top surface 100t of the second substrate 100.

In some example embodiments, the first spacer SP1 and the second spacer SP2 may include different insulating materials. For example, the first spacer SP1 may include silicon oxide, and the second spacer SP2 may include silicon nitride. However, example embodiments of the inventive concepts are not limited thereto. In certain example embodiments, the first spacer SP1 and the second spacer SP2 may include the same insulating material (e.g., silicon oxide).

FIGS. 8 to 12 are cross-sectional views taken along the lines I-I', II-II' and III-III' of FIG. 5 to illustrate a method of manufacturing a 3D semiconductor memory device according to some example embodiments of the inventive concepts. Hereinafter, a method of manufacturing a 3D semiconductor memory device according to some example embodiments will be described in detail with reference to FIGS. 8 to 12.

Figure 8:
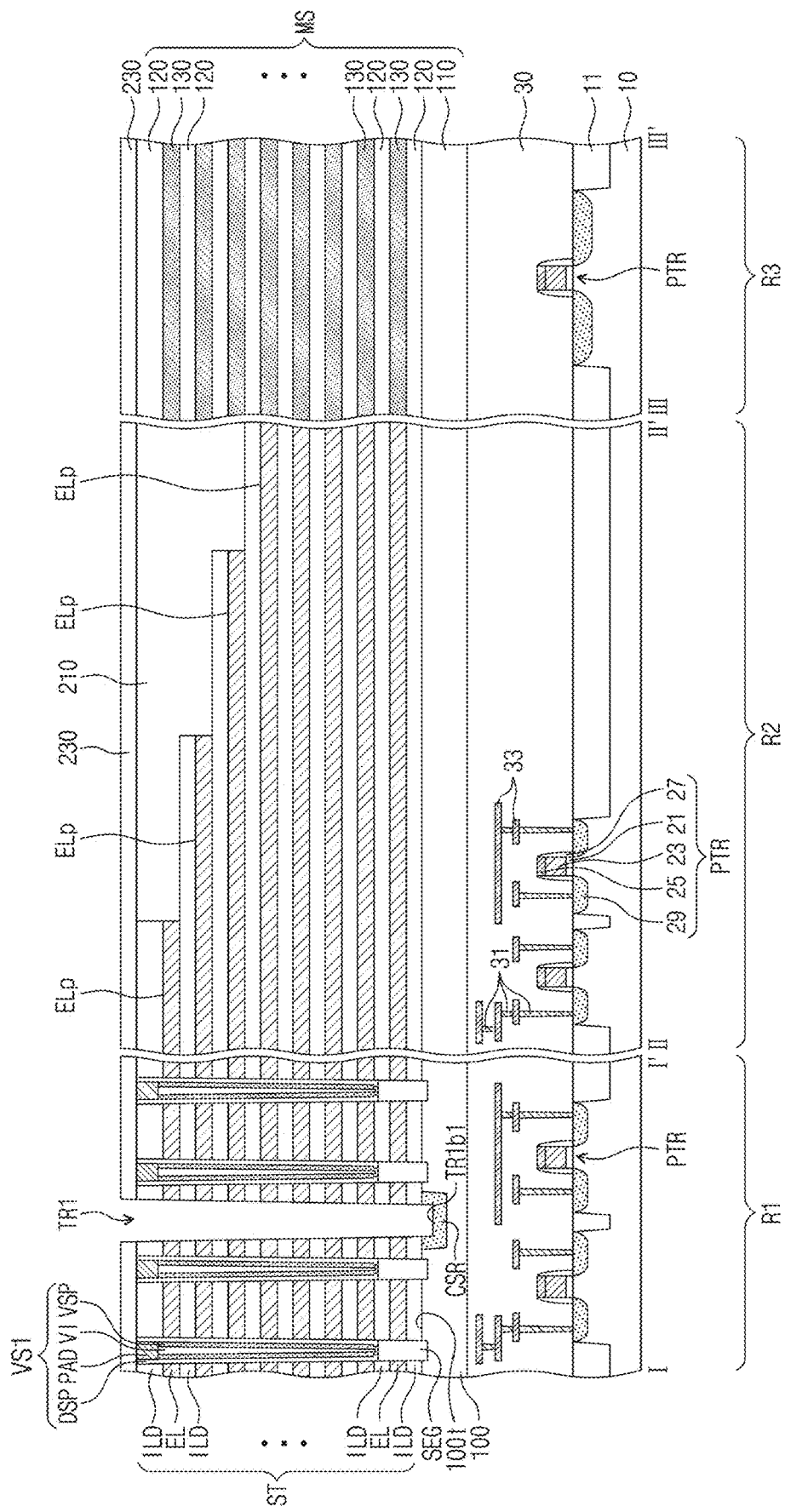
FIGS. 8 to 12 are cross-sectional views taken along the lines I-I', II-II' and III-III' of FIG. 5 to illustrate a method of manufacturing a 3D semiconductor memory device according to some example embodiments of the inventive concepts.

Referring to FIGS. 5 and 8, a first substrate 10 including a first region R1, a second region R2 and a third region R3 may be provided. A device isolation layer 11 may be formed in the first substrate 10 to define active regions. The formation of the device isolation layer 11 may include forming a trench in an upper portion of the first substrate 10, and filling the trench with silicon oxide.

Peripheral circuit transistors PTR may be formed on the active regions defined by the device isolation layer 11. Peripheral contact plugs 31 and peripheral circuit wiring lines 33 may be formed to be connected to peripheral source/drain regions 29 of the peripheral circuit transistors PTR. A first insulating layer 30 may be formed to cover the peripheral circuit transistors PTR, the peripheral contact plugs 31 and the peripheral circuit wiring lines 33.

A second substrate 100 and a second insulating layer 110 may be formed on the first insulating layer 30. The formation of the second substrate 100 and the second insulating layer 110 may include depositing a semiconductor material on the first insulating layer 30, forming a mask pattern covering the first region R1 and the second region R2, removing the semiconductor material on the third region R3 by using the mask pattern, and forming an insulating material on the first insulating layer 30 of the third region R3.

A stack structure ST may be formed on the second substrate 100, and a mold structure MS may be formed on the second insulating layer 110. The formation of the stack structure ST and the mold structure MS may include alternately and repeatedly stacking first mold layers 120 and second mold layers 130 on the second substrate 100 and the second insulating layer 110, performing a trimming process on the first and second mold layers 120 and 130 of the second region R2, forming a first trench TR1 which intersects the first and second mold layers 120 and 130 and extends in the first direction D1, selectively removing the second mold layers 130 on the first region R1 and the second region R2, and forming gate electrodes EL filling spaces formed by the removal of the second mold layers 130.

The second mold layers 130 may be formed of a different insulating material from that of the first mold layers 120. The second mold layers 130 may be formed of a material having an etch selectivity with respect to the first mold layers 120. For example, the second mold layers 130 may be formed of silicon nitride, and the first mold layers 120 may be formed of silicon oxide. Thicknesses of the second mold layers 130 may be substantially equal to each other, and a thickness of at least one of the first mold layers 120 may be different from a thickness of other(s) of the first mold layers 120.

The trimming process may include forming a mask pattern covering a portion of a top surface of an uppermost one of the first mold layers 120 on the first region R1 and the second region R2, patterning the first and second mold layers 120 and 130 of the second region R2 by using the mask pattern, reducing an area of the mask pattern, and patterning the first and second mold layers 120 and 130 of the second region R2 by using the mask pattern having the reduced area. The reducing of the area of the mask pattern and the patterning of the first and second mold layers 120 and 130 by using the mask pattern may be alternately repeated. Due to the trimming process, the first and second mold layers 120 and 130 may have a staircase structure on the second region R2.

The selective removal of the second mold layers 130 exposed by the first trench TR1 may be performed by a wet etching process using an etching solution. At this time, the second mold layers 130 on the third region R3 may not be removed. Even though not shown in the drawings, a separation trench surrounding the third region R3 may be formed to reduce or prevent the second mold layers 130 on the third region R3 from being removed in the wet etching process.

The first mold layers 120 remaining on the first region R1 and the second region R2 after the selective removal of the second mold layers 130 may be referred to as interlayer dielectric layers ILD of the stack structure ST. As a result, the stack structure ST including the interlayer dielectric layers ILD and the gate electrodes EL may be formed on the first region R1 and the second region R2, and the mold structure MS including the second insulating layer 110 and the first and second mold layers 120 and 130 may be formed on the third region R3.

The formation of the stack structure ST and the mold structure MS may further include forming first and second vertical channel structures VS1 and VS2 filling vertical channel holes penetrating the first and second mold layers 120 and 130, between the alternate stacking of the first mold layers 120 and the second mold layers 130 and the performing of the trimming process on the first and second mold layers 120 and 130 of the second region R2.

For example, the formation of the first and second vertical channel structures VS1 and VS2 may include forming an epitaxial layer SEG filling a lower portion of each of the vertical channel holes, forming a data storage pattern DSP and a vertical semiconductor pattern VSP which sequentially cover an inner sidewall of each of the vertical channel holes, forming a filling insulation pattern VI filling a space surrounded by the vertical semiconductor pattern VSP, and forming a conductive pad PAD on the filling insulation pattern VI.

A third insulating layer 210 covering the staircase structure on the second region R2 and a fourth insulating layer 230 covering the third insulating layer 210 and the uppermost one of the first mold layers 120 on the first, second and third regions R1, R2 and R3 may be formed between the performing of the trimming process on the first and second mold layers 120 and 130 and the forming of the first trench TR1.

The first trench TR1 may penetrate the third and fourth insulating layers 210 and 230 and the first and second mold layers 120 and 130 and may further penetrate a portion of the second substrate 100. A bottom surface TR1b1 of the first trench TR1 may be located at a level lower than the top surface 100t of the second substrate 100. A common source region CSR may be formed in the second substrate 100 exposed by the first trench TR1. The formation of the common source region CSR may include performing an ion implantation process on a portion of the second substrate 100. Thus, the bottom surface TR1b1 of the first trench TR1 may be surrounded by the common source region CSR.

Figure 9:
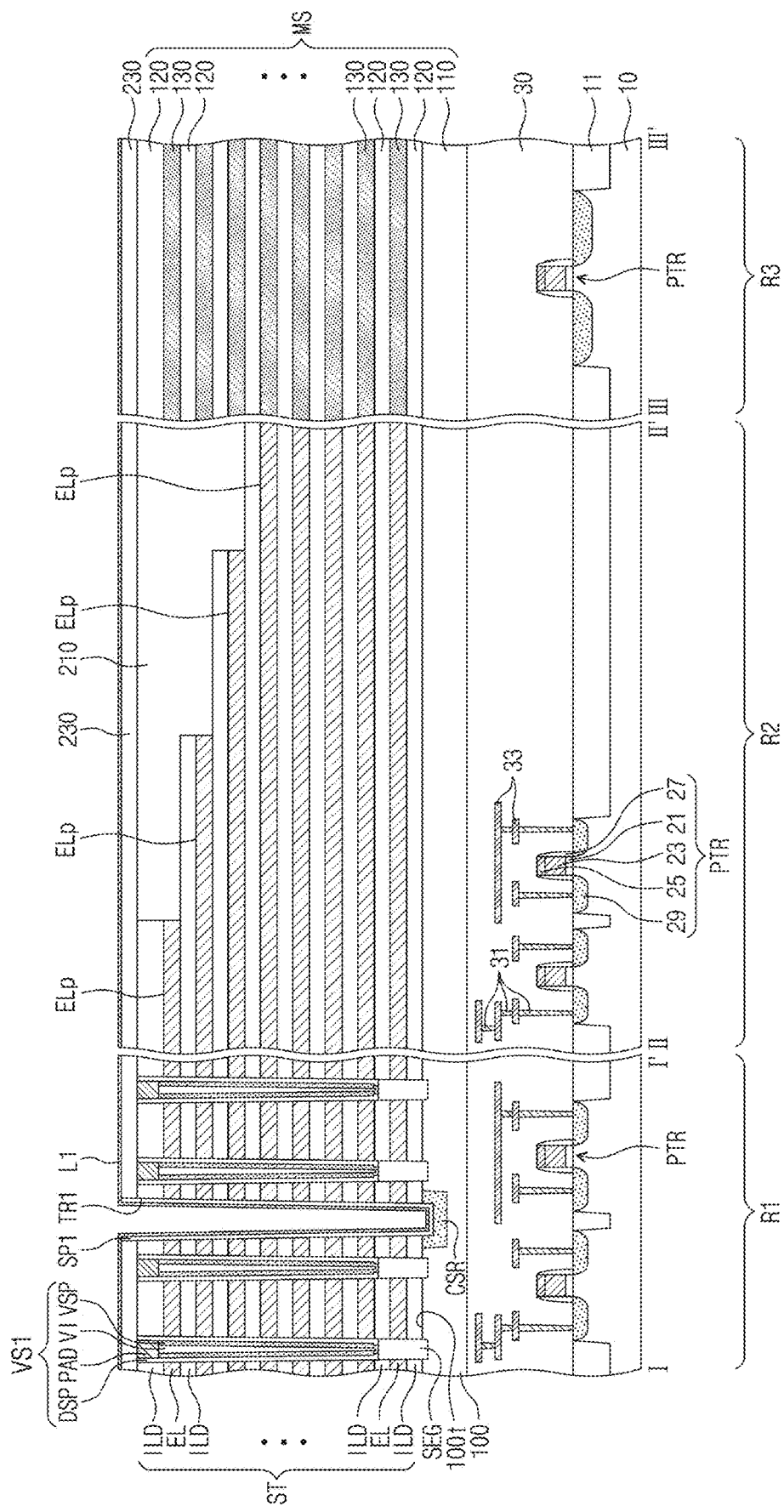

Referring to FIG. 9, a first spacer SP1 may be formed to conformally cover an inner surface of the first trench TR1. The formation of the first spacer SP1 may include forming an insulating layer conformally covering the inner surface of the first trench TR1 and a top surface of the fourth insulating layer 230, and removing the insulating layer on the top surface of the fourth insulating layer 230 by a planarization process. The first spacer SP1 may be formed of, for example, silicon oxide.

Thereafter, a first thin layer L1 may be formed to conformally cover the first spacer SP1 and the top surface of the fourth insulating layer 230. The first thin layer L1 may be formed of, for example, silicon nitride. However, example embodiments of the inventive concepts are not limited thereto.

Figure 10:
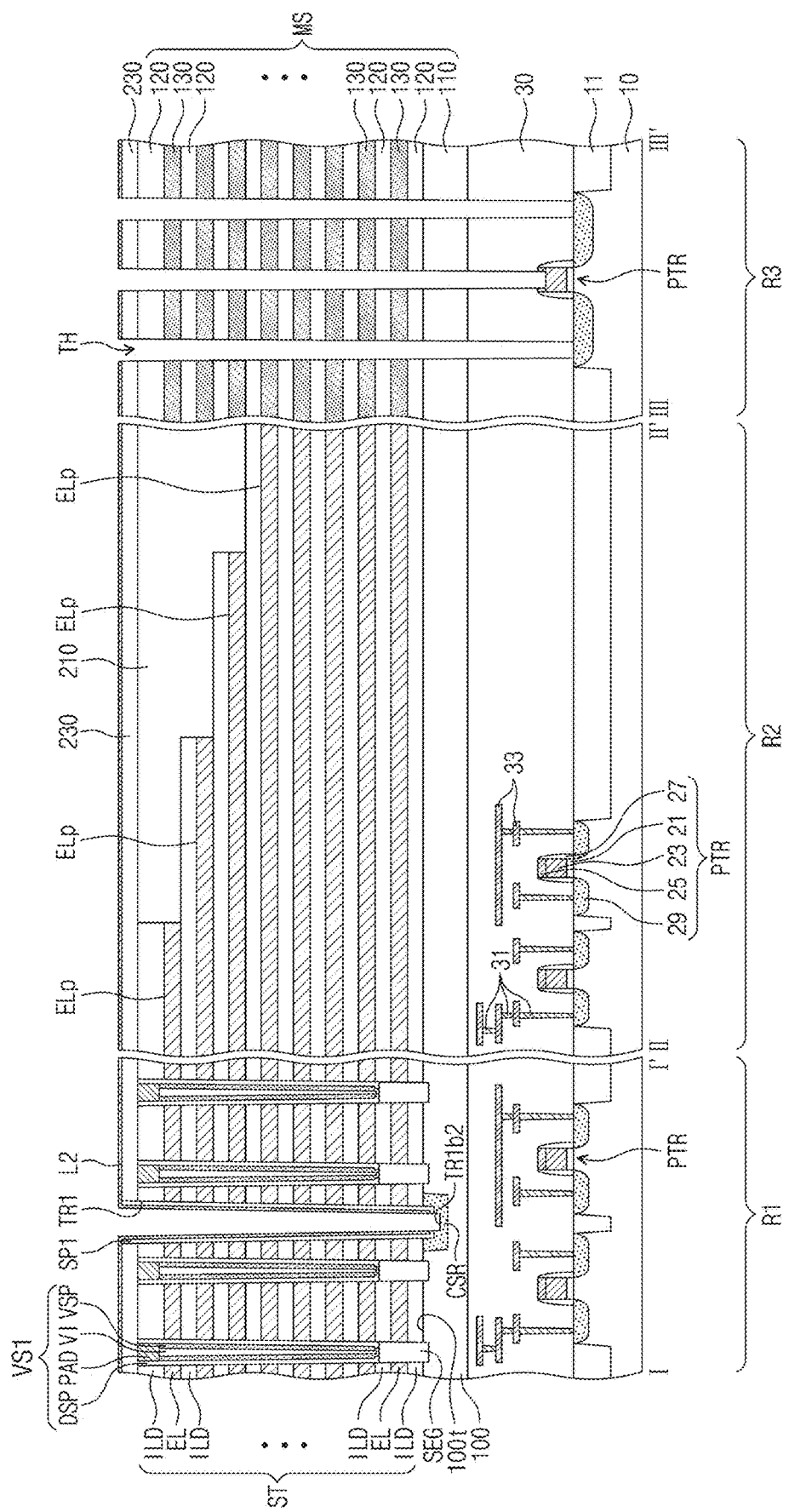

Referring to FIGS. 9 and 10, through-holes TH may be formed to penetrate the first thin layer L1, the mold structure MS and the first insulating layer 30 on the third region R3. The through-holes TH may expose the peripheral source/drain regions 29 and the peripheral gate electrode 23 of the peripheral circuit transistor PTR provided on the third region R3.

Next, a portion of the first spacer SP1 and a portion of the first thin layer L1 in the first trench TR1 on the first region R1 may be removed. At this time, a portion of the common source region CSR may be recessed, and thus a bottom surface TR1b2 of the first trench TR1 may be located at a level lower than a bottom surface of the first spacer SP1. In FIG. 10, the first thin layer L1 of which the portion is removed may be referred to as a second thin layer L2.

Figure 11:
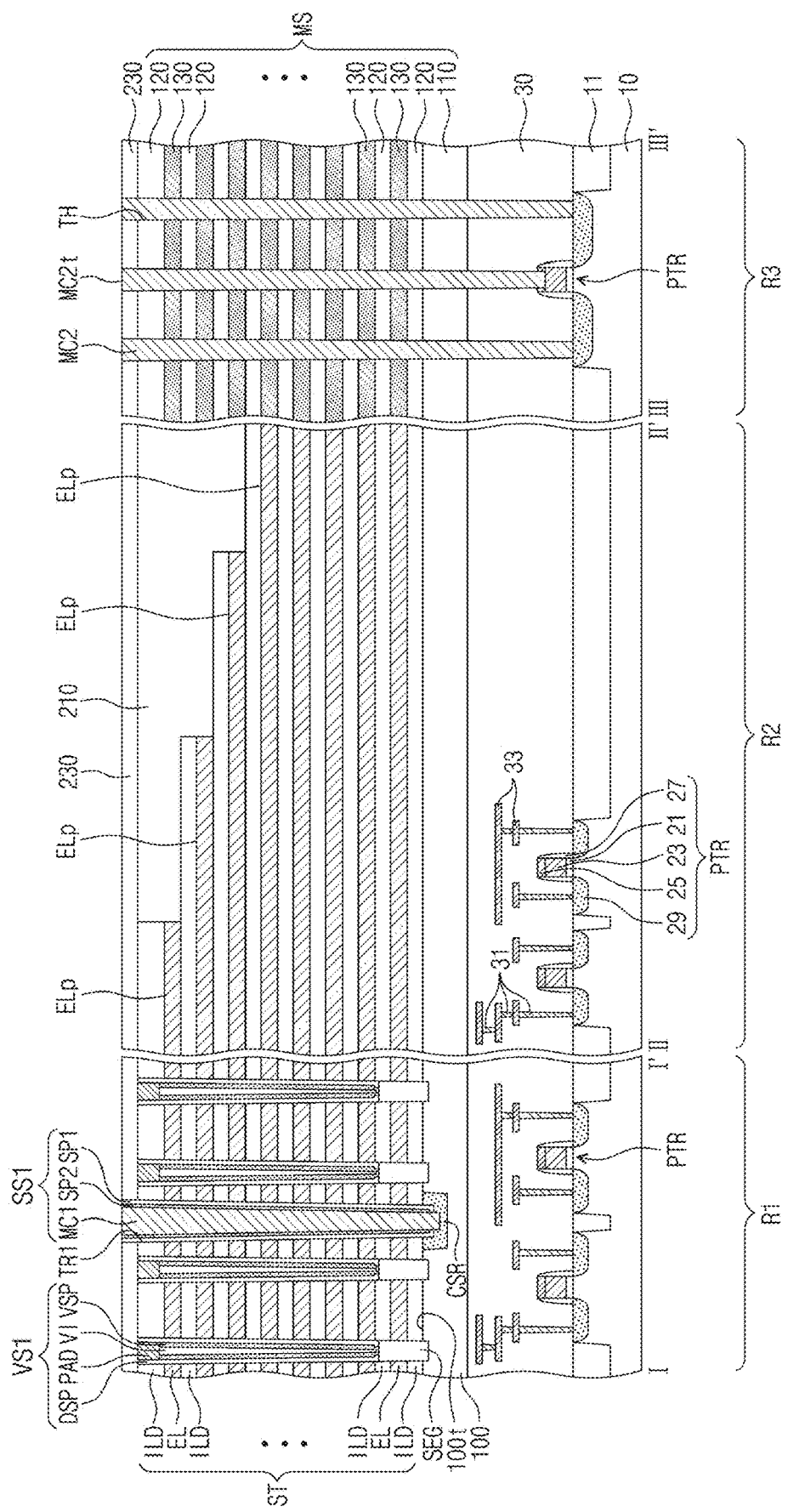

Referring to FIGS. 10 and 11, the second thin layer L2 on the top surface of the fourth insulating layer 230 may be removed by a planarization process. Thereafter, a first conductive contact MC1 filling the first trench TR1 and second conductive contacts MC2 filling the through-holes TH may be formed. The first and second conductive contacts MC1 and MC2 may be formed of the same material by the same process.

The second thin layer L2 of which a portion is removed by the planarization process may be referred to as a second spacer SP2, thereby forming a first separation structure SS1 including the first spacer SP1, the second spacer SP2 and the first conductive contact MC1. A top surface of the first separation structure SS1 may be located at the same or substantially the same level as top surfaces MC2t of the second conductive contacts MC2.

Figure 12:
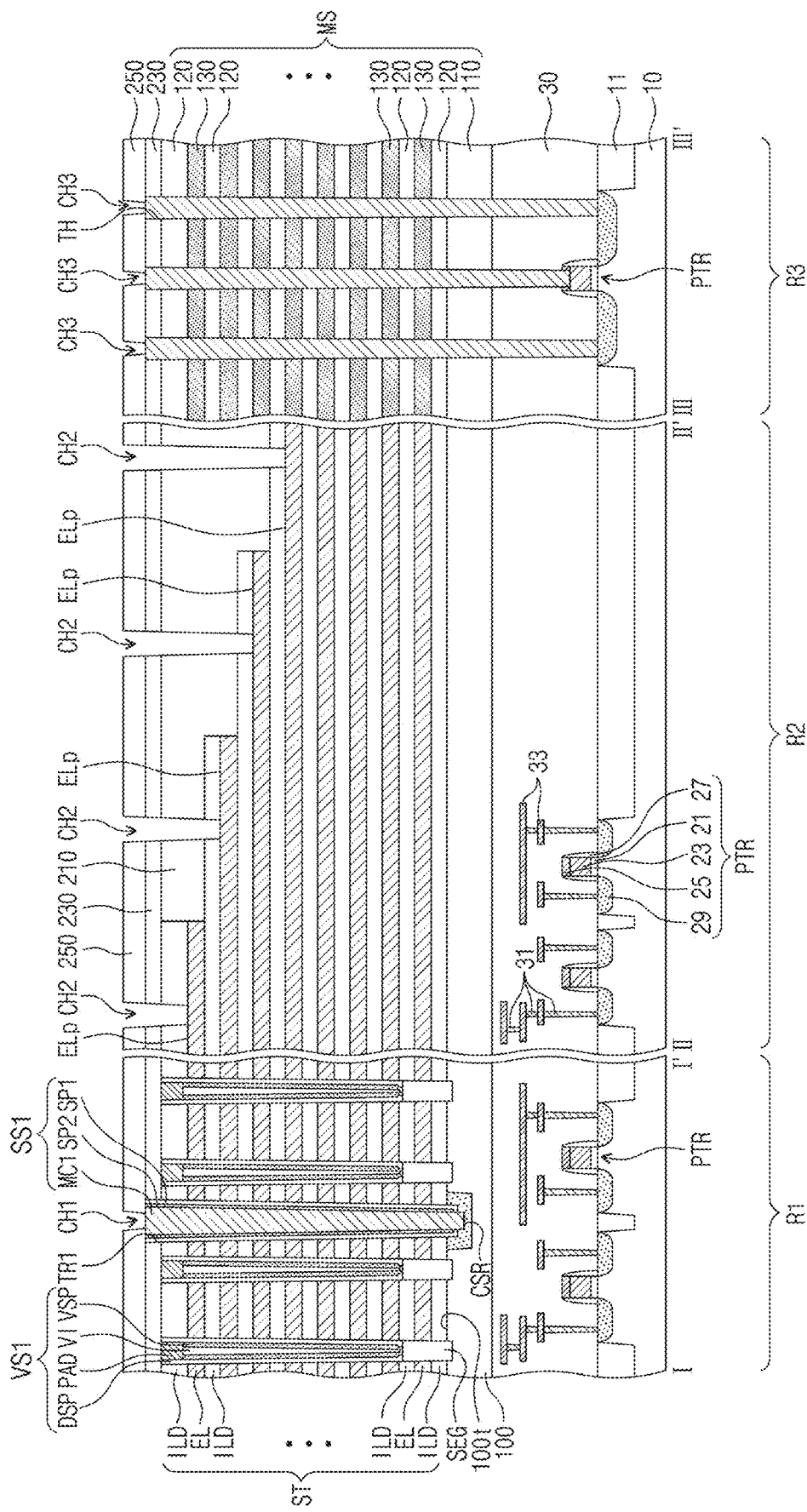

Referring to FIG. 12, a fifth insulating layer 250 may be formed to cover the fourth insulating layer 230 on the first region R1, the second region R2 and the third region R3. Next, a first contact hole CH1, second contact holes CH2 and third contact holes CH3 may be formed. The first contact hole CH1 may penetrate the fifth insulating layer 250 on the first region R1, and the second contact holes CH2 may penetrate the fifth insulating layer 250, the fourth insulating layer 230 and at least a portion of the stack structure ST on the second region R2. The third contact holes CH3 may penetrate the fifth insulating layer 250 on the third region R3. The first to third contact holes CH1, CH2 and CH3 may be formed by the same process.

Referring again to FIGS. 5 and 6, a first contact plug CP1 filling the first contact hole CH1, second contact plugs CP2 filling the second contact holes CH2 and third contact plugs CP3 filling the third contact holes CH3 may be formed. The first to third contact plugs CP1, CP2 and CP3 may be formed of the same material by the same process.

The first to third contact plugs CP1, CP2 and CP3 may be formed after the formation of the first conductive contact MC1 on the first region R1 and the second conductive contacts MC2 on the third region R3, and thus formation of additional spacers on sidewalls of the first to third contact holes CH1, CH2 and CH3 may be omitted to inhibit or prevent contact failure of the first to third contact plugs CP1, CP2 and CP3. Since the contact failure of the first to third contact plugs CP1, CP2 and CP3 is inhibited or prevented, electrical characteristics and reliability of the 3D semiconductor memory device according to the inventive concepts may be improved.

Thereafter, even though not shown in the drawings, a plurality of conductive lines, additional wiring lines and additional vias may be formed on the fifth insulating layer 250. The conductive lines may be connected to the first to third contact plugs CP1, CP2 and CP3, and the additional wiring lines and the additional vias may be connected to the conductive lines.

Figure 13:
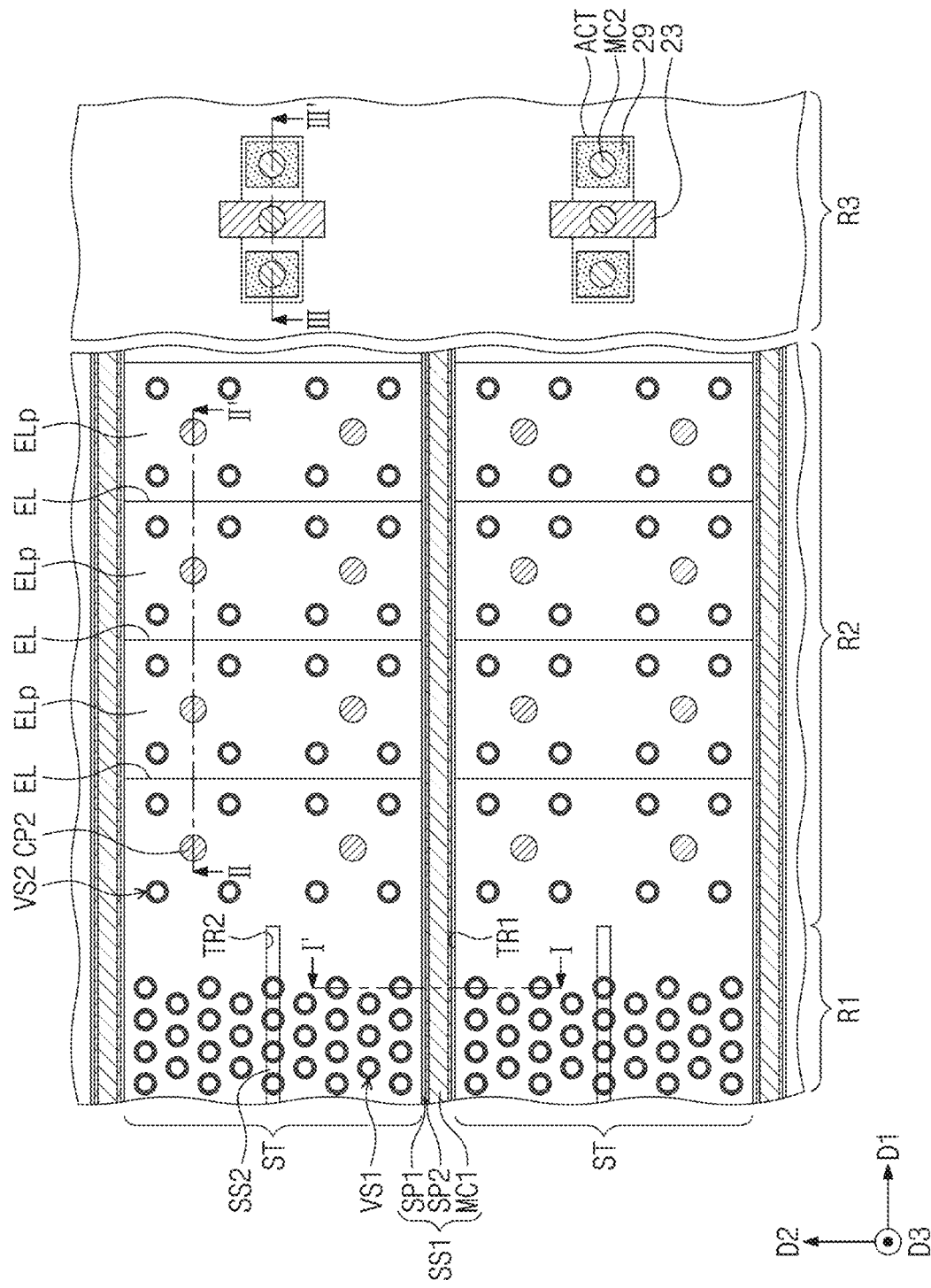
FIG. 13 is a plan view illustrating a 3D semiconductor memory device according to some example embodiments of the inventive concepts.
Figure 14:
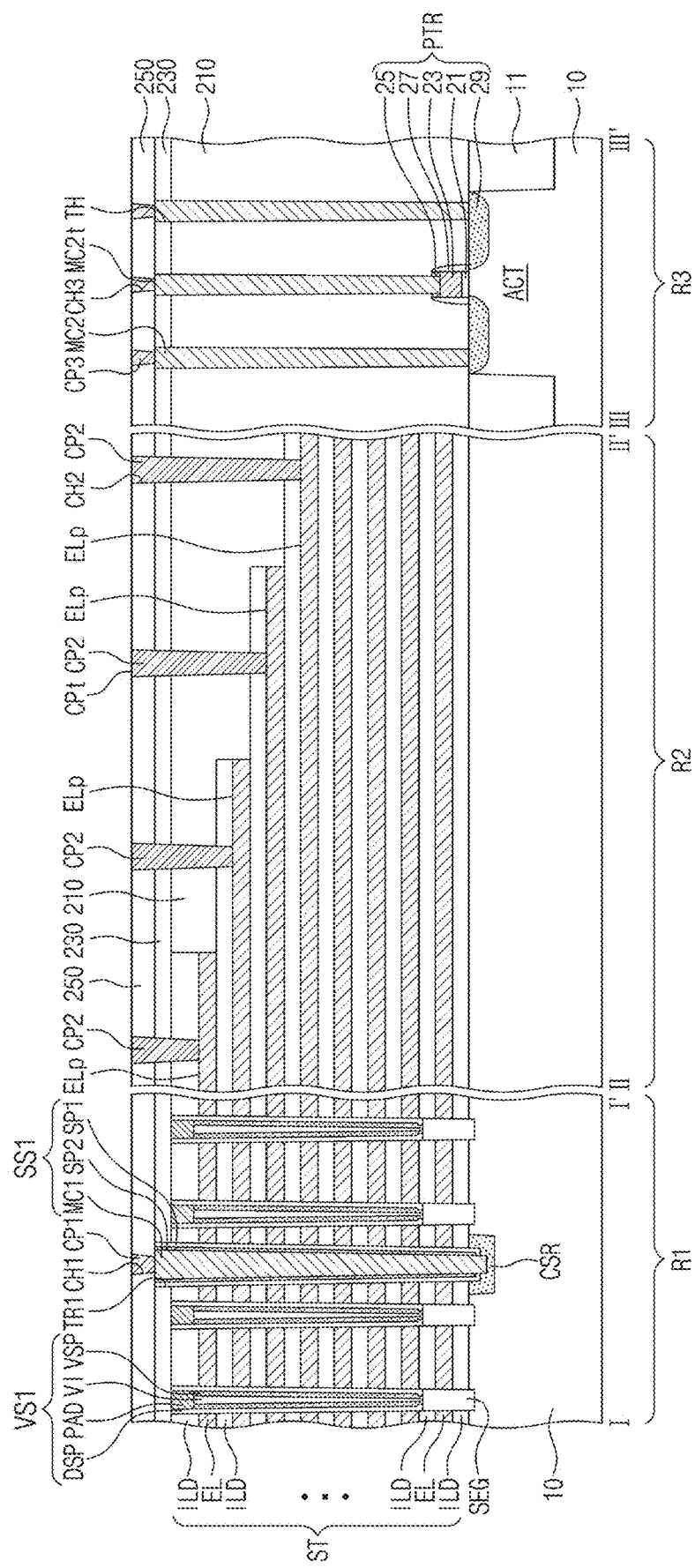
FIG. 14 is a cross-sectional view taken along lines I-I', II-II' and III-III' of FIG. 13 to illustrate a 3D semiconductor memory device according to some example embodiments of the inventive concepts.

FIG. 13 is a plan view illustrating a 3D semiconductor memory device according to some example embodiments of the inventive concepts. FIG. 14 is a cross-sectional view taken along lines I-I', II-II' and III-III' of FIG. 13 to illustrate a 3D semiconductor memory device according to some example embodiments of the inventive concepts. Hereinafter, the descriptions to the same or substantially the same components and features as in the example embodiments of FIGS. 5 and 6 will be omitted for the purpose of ease and convenience in explanation. In other words, differences between the present embodiments and the example embodiments of FIGS. 5 and 6 will be mainly described.

Referring to FIGS. 13 and 14, a 3D semiconductor memory device according to some example embodiments of the inventive concepts may include a substrate 10 and a stack structure ST on the substrate 10. The substrate 10 may include a first region R1, a second region R2, and a third region R3. The second region R2 may extend from a side of the first region R1 in a first direction D1, and the third region R3 may be adjacent to a side of the second region R2 in the first direction D1.

The stack structure ST may be provided on the substrate 10, and a lowermost one of the interlayer dielectric layers ILD of the stack structure ST may be in direct contact with a top surface of the substrate 10.

A device isolation layer 11 may be provided in the substrate 10 of the third region R3. The device isolation layer 11 may define active regions ACT of the substrate 10. Peripheral circuit transistors PTR may be provided on the active regions ACT of the substrate 10.

A third insulating layer 210 may be provided to cover the staircase structure of the stack structure ST on the second region R2. The third insulating layer 210 may cover the substrate 10 and the device isolation layer 11 of the third region R3.

Second conductive contacts MC2 may be provided in through-holes TH penetrating the third and fourth insulating layers 210 and 230 on the third region R3. The second conductive contacts MC2 may overlap with the active regions ACT of the substrate 10 in the third direction D3. Some of the second conductive contacts MC2 may be in contact with the peripheral source/drain regions 29 of the peripheral circuit transistors PTR provided on the third region R3. Others of the second conductive contacts MC2 may be in contact with the peripheral gate electrodes 23 of the peripheral circuit transistors PTR provided on the third region R3.

According to example embodiments of the inventive concepts, the first to third contact plugs may be formed after the formation of the first and second conductive contacts, and thus additional spacers on sidewalls of the first to third contact holes may be omitted. As a result, it is possible to inhibit or prevent the contact failure (e.g., an increase in contact resistance by a material of the additional spacer remaining at a metal-metal interface) of the first to third contact plugs. Since the contact failure of the first to third contact plugs is inhibited or prevented, the electrical characteristics and reliability of the 3D semiconductor memory device according to the inventive concepts may be improved.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
   a substrate;
   a stack structure comprising interlayer dielectric layers and gate electrodes which are alternately and repeatedly stacked on the substrate;
   vertical channel structures penetrating the stack structure;
   a separation structure spaced apart from the vertical channel structures and filling a trench crossing the stack structure, the separation structure comprising a spacer covering an inner sidewall of the trench, and a first conductive contact filling an inner space of the trench surrounded by the spacer;
   an insulating layer covering the substrate and the stack structure;
   contact plugs penetrating the insulating layer so as to be connected to the gate electrodes of the stack structure;
   a second conductive contact spaced apart from the stack structure and penetrating the insulating layer so as to be connected to a peripheral circuit transistor; and
   a common source region vertically overlapping with the separation structure and in an upper portion of the substrate,
   wherein a bottommost surface of the first conductive contact is at a level lower than a bottommost surface of the spacer, the bottommost surface of the first conductive contact is at a level lower than a bottommost surface of the vertical channel structures and a topmost surface of the substrate,
   wherein the common source region covers the bottommost surface of the first conductive contact and a portion of sidewalls of the first conductive contact,
   wherein the spacer comprises:
      a first spacer covering the inner sidewall of the trench; and
      a second spacer between the first spacer and the first conductive contact,
   wherein a bottommost surface of the first spacer is at a level lower than a bottommost surface of the second spacer, and
   wherein the bottommost surface of the second spacer is at a level lower than the topmost surface of the substrate.

2. The 3D semiconductor memory device of claim 1, wherein a top surface of the first conductive contact and a top surface of the second conductive contact are at substantially the same level.

3. The 3D semiconductor memory device of claim 2, wherein the top surface of the first conductive contact and the top surface of the second conductive contact are at a level lower than top surfaces of the contact plugs.

4. The 3D semiconductor memory device of claim 3, wherein the top surface of the first conductive contact and the top surface of the second conductive contact are at a higher level than top surfaces of the vertical channel structures.

5. The 3D semiconductor memory device of claim 1, wherein the first spacer includes:
   a first portion extending in a vertical direction along the inner sidewall of the trench; and
   a second portion extending from the first portion in a horizontal direction,
   wherein the second portion is between the bottommost surface of the second spacer and the substrate.

6. The 3D semiconductor memory device of claim 5, wherein the second portion is in contact with a sidewall of the first conductive contact.

7. The 3D semiconductor memory device of claim 1, wherein the first spacer includes silicon oxide, and
   wherein the second spacer includes silicon nitride.

8. The 3D semiconductor memory device of claim 1, further comprising:
   a peripheral circuit structure under the substrate,
   wherein the peripheral circuit transistor is in the peripheral circuit structure, and
   wherein the second conductive contact penetrates at least a portion of the peripheral circuit structure.

9. The 3D semiconductor memory device of claim 1, wherein
   the first conductive contact consists of a single conductive material, and
   the first conductive contact directly contacts the spacer and the substrate.

10. The 3D semiconductor memory device of claim 1, wherein the first spacer and the second spacer are distinct layers and include a same insulating material.

11. A three-dimensional (3D) semiconductor memory device comprising:
    a substrate;
    a stack structure comprising interlayer dielectric layers and gate electrodes which are alternately and repeatedly stacked on the substrate;
    vertical channel structures in vertical channel holes penetrating the stack structure;
    a separation structure spaced apart from the vertical channel structures and filling a trench crossing the stack structure, the separation structure comprising a spacer covering an inner sidewall of the trench, and a first conductive contact filling an inner space of the trench surrounded by the spacer;
    a common source region vertically overlapping with the separation structure and in an upper portion of the substrate;
    an insulating layer covering the substrate and the stack structure;
    a second conductive contact spaced apart from the stack structure and penetrating the insulating layer so as to be connected to a peripheral circuit transistor;
    a first contact plug penetrating the insulating layer so as to be in contact with the first conductive contact of the separation structure;
    second contact plugs penetrating the insulating layer and at least a portion of the stack structure so as to be connected to the gate electrodes; and
    a third contact plug penetrating the insulating layer so as to be in contact with the second conductive contact,
    wherein a top surface of the first conductive contact and a top surface of the second conductive contact are at a level lower than top surfaces of the first contact plug, the second contact plugs, and the third contact plugs and higher than top surfaces of the vertical channel structures, and
    wherein a bottommost surface of the first conductive contact is at a level lower than a bottommost surface of the spacer, the bottommost surface of the first conductive contact is at a level lower than a bottommost surface of the vertical channel structures, wherein the spacer comprises:
  a first spacer covering the inner sidewall of the trench and a portion of a bottom surface of the trench; and
  a second spacer disposed between the first spacer and the first conductive contact,
wherein the second spacer is spaced apart from the common source region with a portion of the first spacer interposed therebetween,
wherein the top surface of the first contact plug and the top surface of the third contact plug are coplanar with each other
wherein a bottommost surface of the first spacer is at a level lower than a bottommost surface of the second spacer, and
wherein the bottommost surface of the second spacer is at a level lower than a topmost surface of the substrate.

12. The 3D semiconductor memory device of claim 11, wherein each of the vertical channel structures comprises:
  an epitaxial layer filling a lower portion of each of the vertical channel holes;
  a data storage pattern conformally covering an inner sidewall of each of the vertical channel holes;
  a vertical semiconductor pattern conformally covering an inner sidewall of the data storage pattern and a top surface of the epitaxial layer;
  a filling insulation pattern surrounded by the vertical semiconductor pattern; and
  a conductive pad on the filling insulation pattern,
  wherein the data storage pattern comprises a plurality of insulating layers vertically extending between the stack structure and the vertical semiconductor pattern.

13. The 3D semiconductor memory device of claim 11, wherein a width of a lower portion of the first contact plug is different from a width of an upper portion of the first conductive contact, and
  wherein a width of a lower portion of the third contact plug is different from a width of an upper portion of the second conductive contact.

14. The 3D semiconductor memory device of claim 11, wherein a height of each of the second contact plugs is greater than a height of each of the first contact plug and the third contact plug.

15. An electronic system comprising:
  a three-dimensional (3D) semiconductor memory device comprising a first substrate, a peripheral circuit structure on the first substrate, a cell array structure on the peripheral circuit structure, an insulating layer covering the cell array structure, and an input/output pad on the insulating layer and electrically connected to the peripheral circuit structure; and
  a controller electrically connected to the 3D semiconductor memory device through the input/output pad and configured to control the 3D semiconductor memory device,
  wherein the cell array structure comprises:
    a second substrate on the peripheral circuit structure;
    a stack structure comprising interlayer dielectric layers and gate electrodes which are alternately and repeatedly stacked on the second substrate;
    vertical channel structures penetrating the stack structure;
    a separation structure spaced apart from the vertical channel structures and filling a trench crossing the stack structure, the separation structure comprising a spacer covering an inner sidewall of the trench, and a first conductive contact filling an inner space of the trench surrounded by the spacer;
    contact plugs penetrating the insulating layer so as to be connected to the gate electrodes of the stack structure;
    a second conductive contact spaced apart from the stack structure and penetrating the insulating layer so as to be electrically connected to the peripheral circuit structure; and
    a common source region vertically overlapping with the separation structure and in an upper portion of the second substrate,
  wherein a bottommost surface of the first conductive contact is at a level lower than a bottommost surface of the spacer, the bottommost surface of the first conductive contact is at a level lower than a bottommost surface of the vertical channel structures and a topmost surface of the second substrate, and
  wherein the common source region covers the bottommost surface of the first conductive contact and a portion of sidewalls of the first conductive contact,
  wherein the spacer comprises:
    a first spacer covering the inner sidewall of the trench; and
    a second spacer between the first spacer and the first conductive contact,
  wherein a bottommost surface of the first spacer is at a level lower than a bottommost surface of the second spacer, and
  wherein the bottommost surface of the second spacer is at a level lower than the topmost surface of the second substrate.

16. The electronic system of claim 15, wherein the cell array structure further comprises a mold structure on the peripheral circuit structure,
  wherein the mold structure comprises first mold layers and second mold layers which are alternately and repeatedly stacked on the peripheral circuit structure, and
  wherein the second conductive contact penetrates the first mold layers and the second mold layers.

17. The electronic system of claim 16, wherein the first mold layers include silicon oxide,
  wherein the second mold layers include silicon nitride, and
  wherein the first mold layers overlap with the interlayer dielectric layers of the stack structure in a horizontal direction, respectively.

18. The electronic system of claim 15, wherein a top surface of the first conductive contact and a top surface of the second conductive contact are at a level lower than top surfaces of the contact plugs and higher than top surfaces of the vertical channel structures, and
  wherein a height of the second conductive contact is greater than a height of the first conductive contact.

* * * * *